United States Patent
Kawakami et al.

(10) Patent No.: US 10,139,732 B2
(45) Date of Patent: Nov. 27, 2018

(54) SUBSTRATE PROCESSING APPARATUS, SUBSTRATE PROCESSING METHOD AND RECORDING MEDIUM

(71) Applicant: Tokyo Electron Limited, Tokyo (JP)

(72) Inventors: Shinichiro Kawakami, Koshi (JP); Hiroshi Mizunoura, Koshi (JP); Shinichi Hatakeyama, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/941,298

(22) Filed: Mar. 30, 2018

(65) Prior Publication Data

US 2018/0284616 A1    Oct. 4, 2018

(30) Foreign Application Priority Data

Mar. 31, 2017   (JP) ................. 2017-071668

(51) Int. Cl.
| | |
|---|---|
| *G03D 5/00* | (2006.01) |
| *G03F 7/32* | (2006.01) |
| *G03F 7/42* | (2006.01) |
| *G03F 7/30* | (2006.01) |
| *G03F 7/11* | (2006.01) |

(52) U.S. Cl.
CPC ............. *G03F 7/32* (2013.01); *G03F 7/11* (2013.01); *G03F 7/3021* (2013.01); *G03F 7/422* (2013.01); *G03F 7/423* (2013.01)

(58) Field of Classification Search
USPC ....................................... 396/611
See application file for complete search history.

(56) References Cited

U.S. PATENT DOCUMENTS

| | | | | |
|---|---|---|---|---|
| 7,241,061 B2 * | 7/2007 | Akimoto | ............... | H01L 21/00 257/E21.001 |
| 7,267,497 B2 * | 9/2007 | Akimoto | ........... | H01L 21/67173 118/52 |
| 8,888,387 B2 * | 11/2014 | Matsuoka | ........... | H01L 21/6715 396/611 |
| 8,985,880 B2 * | 3/2015 | Matsuoka | ................ | G03F 7/16 355/27 |
| 2006/0163621 A1 * | 7/2006 | Hasei | ....................... | H03H 3/08 257/254 |

(Continued)

FOREIGN PATENT DOCUMENTS

JP    2016-029498 A    3/2016

*Primary Examiner* — Rodney Fuller
(74) *Attorney, Agent, or Firm* — Pearne & Gordon LLP

(57) ABSTRACT

A coating and developing apparatus 2 includes a first protection processing unit U01, a film forming unit U02, a first cleaning processing unit U03 and a control unit U08. The control unit U08 is configured to control the first protection processing unit U01 to form a first protective film on a peripheral portion Wc of a wafer W, control the film forming unit U02 to form a resist film on a front surface Wa of the wafer W, control the first cleaning processing unit U03 to supply a first cleaning liquid for removing the resist film to the peripheral portion Wc, control the first cleaning processing unit U03 to supply a second cleaning liquid for removing a metal component to the peripheral portion Wc, and control the first cleaning processing unit U03 to supply a third cleaning liquid for removing the first protective film PF1 to the peripheral portion Wc.

17 Claims, 27 Drawing Sheets

(56) References Cited

U.S. PATENT DOCUMENTS

2006/0165409 A1* 7/2006 Akimoto ............... H01L 21/00
                                                      396/611
2008/0118861 A1* 5/2008 Kosugi .................. G03F 7/11
                                                      430/270.1
2018/0088466 A1* 3/2018 Kawakami ............. G03F 7/11

* cited by examiner

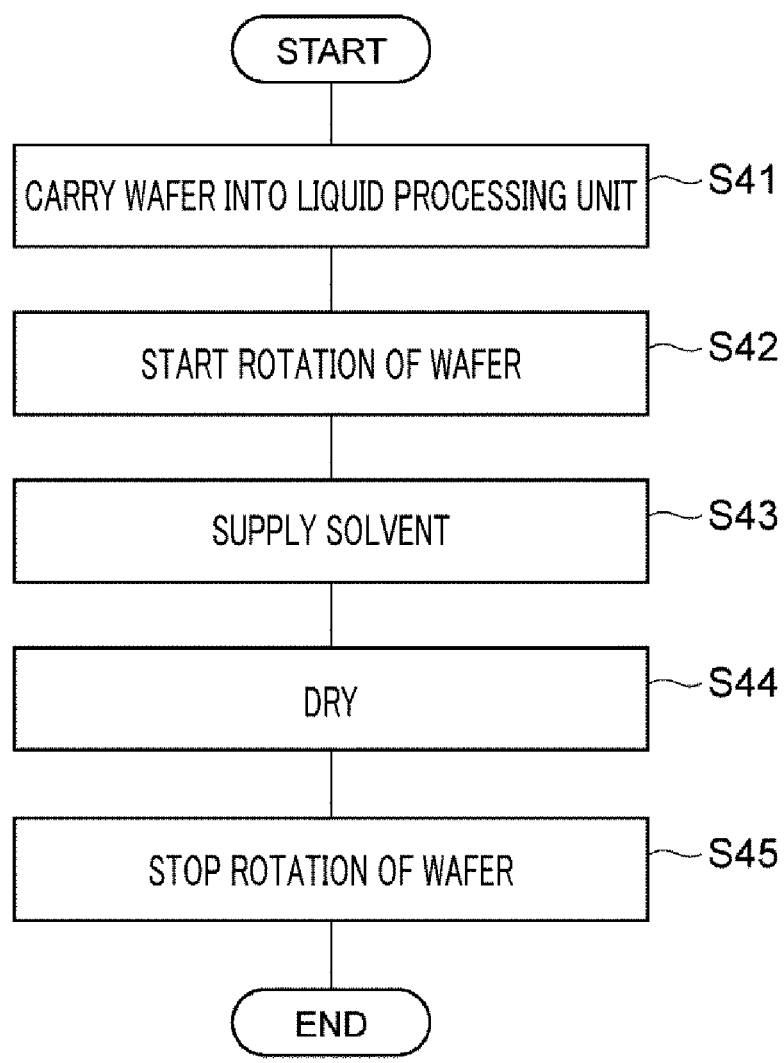

SUBSTRATE PROCESSING APPARATUS, SUBSTRATE PROCESSING METHOD AND RECORDING MEDIUM

CROSS-REFERENCE TO RELATED APPLICATION

This application claims the benefit of Japanese Patent Application No. 2017-071668 filed on Mar. 31, 2017, the entire disclosures of which are incorporated herein by reference.

TECHNICAL FIELD

The embodiments described herein pertain generally to a substrate processing apparatus, a substrate processing method and a recording medium.

BACKGROUND

Patent Document 1 describes a substrate processing method of forming a layer of a coating material containing a metal on a substrate.

Patent Document 1: Japanese Patent Laid-open Publication No. 2016-029498

SUMMARY

The layer of the coating material containing the metal (hereinafter, referred to as "metal-containing film") can be utilized in various manners in a substrate processing. By way of example, by using the metal-containing film as a resist film, sensitivity to an exposure processing is expected to be improved. Further, by using the metal-containing film as a so-called hard mask, improvement of etching resistance is also expected. When using the metal-containing film, however, metal contamination of the substrate itself and devices in contact with the substrate needs to be suppressed.

In view of the foregoing, exemplary embodiments provide a substrate processing apparatus and a substrate processing method capable of suppressing metal contamination which might be caused by the use of the metal-containing film.

In one exemplary embodiment, a substrate processing apparatus includes a first protection processing unit configured to form a first protective film on a peripheral portion of a substrate; a film forming unit configured to form a film containing a metal on a front surface of the substrate; a first cleaning processing unit configured to perform a cleaning processing of the peripheral portion of the substrate on which the film is formed; and a control unit. The control unit is configured to control the first protection processing unit to form the first protective film on the peripheral portion of the substrate, control the film forming unit to form the film on the front surface of the substrate on which the first protective film is formed, control the first cleaning processing unit to supply a first chemical liquid for removing the film to the peripheral portion of the substrate on which the film is formed, control the first cleaning processing unit to supply a second chemical liquid for removing a metal component to the peripheral portion of the substrate after the first chemical liquid is supplied to the peripheral portion of the substrate, and control the first cleaning processing unit to supply a third chemical liquid for removing the first protective film to the peripheral portion of the substrate after the second chemical liquid is supplied to the peripheral portion of the substrate.

According to this substrate processing apparatus, by forming the film on the front surface of the substrate in the state that the first protective film is formed on the peripheral portion of the substrate, the adhesion of the metal component to the peripheral portion of the substrate can be suppressed. After a peripheral portion of the film is removed, by removing the first protective film, the metal component remaining at the first protective film is also removed. Thus, the metal component can be sufficiently suppressed from being left at the peripheral portion of the substrate.

However, the present inventors have discovered that the metal component may be left at the peripheral portion of the substrate even after the first protective film is removed. As a reason for this phenomenon, it may be deemed that a part of the metal component remaining at a surface of the first protective film may adhere to the peripheral portion of the substrate while removing the first protective film. As a countermeasure to the metal component remaining even after the first protective film is removed, it may be considered to additionally clean the peripheral portion of the substrate after the first protective film is removed. Since, however, the substrate is exposed to the chemical liquid having high cleaning power to the metal component, the substrate may be corroded.

Meanwhile, according to the substrate processing apparatus of the exemplary embodiment, the supply of the second chemical liquid for removing the metal component is performed prior to the supply of the third chemical liquid for removing the first protective film. By supplying the second chemical liquid, most of the metal component remaining at the first protective film is removed. At this time, since the peripheral portion of the substrate is protected by the first protective film, the corrosion of the substrate by the second chemical liquid is suppressed. By supplying the second chemical liquid prior to the supply of the third chemical liquid, the first protective film is removed in the state that the metal component remaining at the first protective film is greatly reduced. Accordingly, the metal component left at the peripheral portion of the substrate after the first protective film is removed is greatly reduced. Hence, the metal contamination that might be caused by the use of the metal-containing film can be suppressed.

The second chemical liquid may have strong acidity as compared to the first chemical liquid and the third chemical liquid. In this case, larger amount of the metal component can be removed before the first protective film is removed.

The control unit may be further configured to control the first cleaning processing unit to supply the first chemical liquid to the peripheral portion of the substrate before the third chemical liquid is supplied to the peripheral portion of the substrate and after the second chemical liquid is supplied to the peripheral portion thereof. In this case, by removing a remaining component of the second chemical liquid through the supply of the first chemical liquid, a material remaining at the peripheral portion of the substrate after the removal of the first protective film can be additionally reduced.

The substrate processing apparatus may further include a heat treatment unit configured to heat the film. The control unit may be further configured to control the heat treatment unit to heat the film of the substrate before the third chemical liquid is supplied to the peripheral portion of the substrate and after the first chemical liquid is supplied to the peripheral portion of the substrate on which the film is formed. In this case, by heating the film, strength of the film is improved. Prior to improving the strength of the film through the heating, by supplying the first chemical liquid to the peripheral portion of the substrate, the removal of the peripheral portion thereof can be easily performed. By improving the strength of the film through the heating before the supply of the third chemical liquid, elution of the metal component from the film during the supply of the third chemical liquid can be more securely suppressed. Accordingly, the metal component remaining at the peripheral portion of the substrate can be more securely reduced.

The control unit may be configured to control the heat treatment unit to heat the film of the substrate before the second chemical liquid is supplied to the peripheral portion of the substrate and after the first chemical liquid is supplied to the peripheral portion of the substrate on which the film is formed. In this case, by improving the strength of the film through the heating before the supply of the second chemical liquid, the elution of the metal component from the film during the supply of the second chemical liquid can be more securely suppressed. Accordingly, the metal component remaining at the peripheral portion of the substrate can be more securely reduced.

The control unit may be further configured to control the heat treatment unit to heat the film of the substrate after the third chemical liquid is supplied to the peripheral portion of the substrate. In this case, by performing the processes of removing an unnecessary portion of the film altogether before the process of heating the film, efficiency of the substrate processing can be improved.

The substrate processing apparatus may further include a second protection processing unit configured to form a second protective film on the peripheral portion of the substrate; a developing processing unit configured to perform a developing processing of the film; and a second cleaning processing unit configured to perform a cleaning processing of the peripheral portion of the substrate on which the developing processing of the film is performed. The control unit may be further configured to control the second protection processing unit to form the second protective film on the peripheral portion of the substrate after the third chemical liquid is supplied to the peripheral portion of the substrate, control the developing processing unit to perform the developing processing of the film of the substrate on which the second protective film is formed, control the second cleaning processing unit to supply a fourth chemical liquid for removing the metal component to the peripheral portion of the substrate on which the developing processing of the film is performed, and control the second cleaning processing unit to supply a fifth chemical liquid for removing the second protective film to the peripheral portion of the substrate after the fourth chemical liquid is supplied to the peripheral portion of the substrate. In this case, the same sequence including the formation of the first protective film, the removal of the metal component by the second chemical liquid and the removal of the first protective film by the third chemical liquid, which are performed in the stage of forming the film, is also performed in the developing stage of the film, so that the metal component left at the peripheral portion of the substrate can be more securely reduced.

The substrate processing apparatus may further include a developing processing unit configured to perform a developing processing of the film; and a second cleaning processing unit configured to perform a cleaning processing of the peripheral portion of the substrate on which the developing processing of the film is performed. The control unit may be further configured to control the developing processing unit to perform the developing processing of the film of the substrate before the third chemical liquid is supplied to the peripheral portion of the substrate and after the second chemical liquid is supplied to the peripheral portion thereof, and control the second cleaning processing unit to supply a fourth chemical liquid for removing the metal component to the peripheral portion of the substrate before the third chemical liquid is supplied to the peripheral portion of the substrate on which the developing processing of the film is performed. In this case, the first protective film is commonly shared in the stage of forming the film and in the stage of developing the film, so that the efficiency of the substrate processing can be improved.

In another exemplary embodiment, a substrate processing method includes forming a first protective film on a peripheral portion of a substrate; forming a film containing a metal on a front surface of the substrate on which the first protective film is formed; supplying a first chemical liquid for removing the film to the peripheral portion of the substrate on which the film is formed; supplying a second chemical liquid for removing a metal component to the peripheral portion of the substrate after the supplying of the first chemical liquid to the peripheral portion of the substrate; and supplying a third chemical liquid for removing the first protective film to the peripheral portion of the substrate after the supplying of the second chemical liquid to the peripheral portion of the substrate.

The second chemical liquid may have strong acidity as compared to the first chemical liquid and the third chemical liquid.

The substrate processing method may further include supplying the first chemical liquid to the peripheral portion of the substrate before the supplying of the third chemical liquid to the peripheral portion of the substrate and after the supplying of the second chemical liquid to the peripheral portion of the substrate.

The substrate processing method may further include heating the film of the substrate before the supplying of the third chemical liquid to the peripheral portion of the substrate and after the supplying of the first chemical liquid to the peripheral portion of the substrate on which the film is formed.

The heating of the film of the substrate may be performed before the supplying of the second chemical liquid to the peripheral portion of the substrate and after the supplying of the first chemical liquid to the peripheral portion of the substrate on which the film is formed.

The substrate processing method may further include heating the film of the substrate after the supplying of the third chemical liquid to the peripheral portion of the substrate.

The substrate processing method may further include forming a second protective film on the peripheral portion of the substrate after the supplying of the third chemical liquid to the peripheral portion of the substrate; performing a developing processing of the film of the substrate on which the second protective film is formed; supplying a fourth chemical liquid for removing the metal component to the peripheral portion of the substrate on which the developing processing of the film is performed; and supplying a fifth chemical liquid for removing the second protective film to the peripheral portion of the substrate after the supplying of the fourth chemical liquid to the peripheral portion of the substrate.

The substrate processing method may further include performing a developing processing of the film of the substrate before the supplying of the third chemical liquid to the peripheral portion of the substrate and after the supplying of the second chemical liquid to the peripheral portion of the substrate; and supplying a fourth chemical liquid for removing the metal component to the peripheral portion of the substrate before the supplying of the third chemical liquid to the peripheral portion of the substrate on which the developing processing of the film is performed.

In yet another exemplary embodiment, there is provided a computer-readable recording medium having stored thereon computer-executable instructions that, in response to execution, cause an apparatus to perform the substrate processing method.

According to the exemplary embodiments, it is possible to suppress the metal contamination that might be caused by the use of the metal-containing film.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 17 is a flowchart for describing a sequence of the protective film removal;

DETAILED DESCRIPTION

Figure 1:
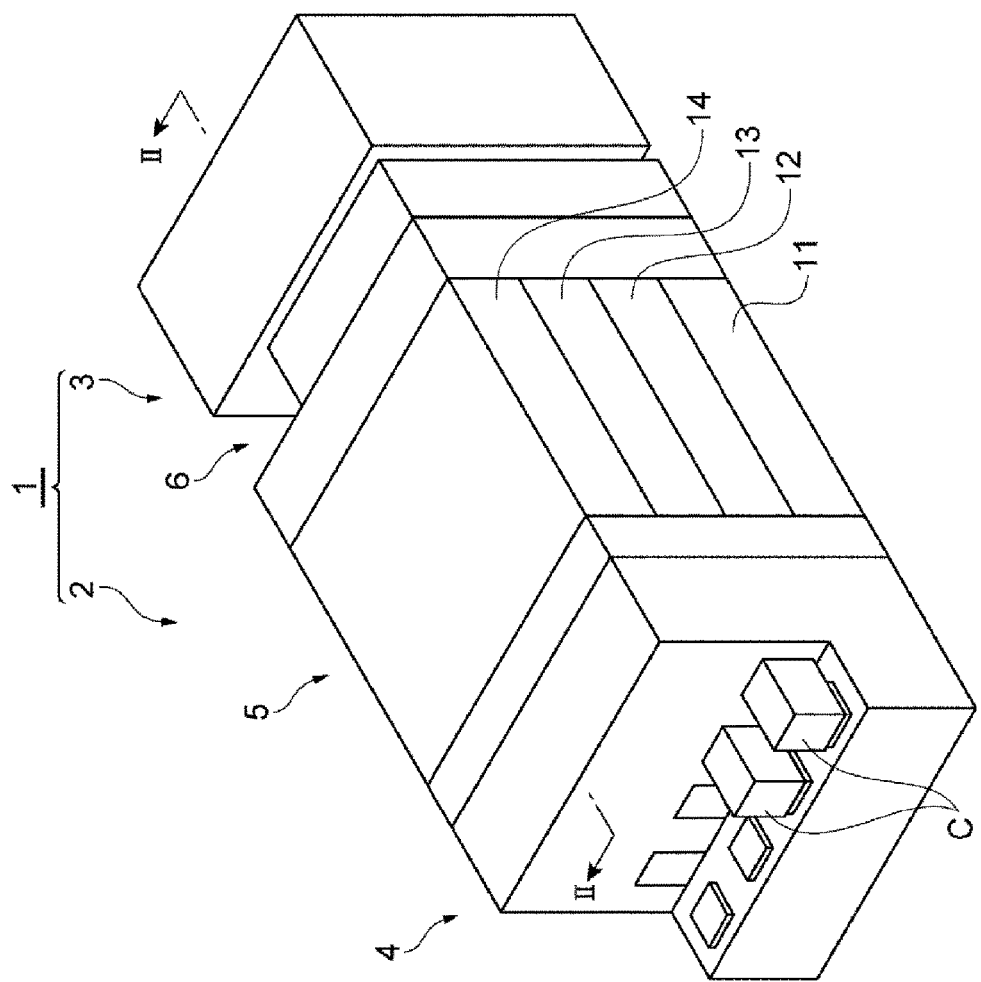
FIG. 1 is a perspective view illustrating a schematic configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments of the present disclosure will be described with reference to the accompanying drawings. In the specification and drawings, parts having substantially the same function and configuration will be assigned same reference numerals, and redundant description will be omitted.

<Substrate Processing System>

A substrate processing system 1 shown in FIG. 1 is a system configured to perform, on a substrate, formation of a photosensitive film, exposure of the corresponding photosensitive film and development of the corresponding photosensitive film. The substrate as a processing target is, for example, a semiconductor wafer W. The photosensitive film is, by way of non-limiting example, a resist film. The substrate processing system 1 includes a coating and developing apparatus 2 and an exposure apparatus 3. The exposure apparatus 3 is configured to perform an exposure processing of the resist film (photosensitive film) formed on the wafer W (substrate). To elaborate, the exposure apparatus 3 irradiates an energy beam to an exposure target portion of the resist film by an immersion exposure method or the like. The coating and developing apparatus 2 is configured to perform a processing of forming the resist film on a surface of the wafer W (substrate) prior to the exposure processing by the exposure apparatus 3 and perform a developing processing of the resist film after the exposure processing.

<Substrate Processing Apparatus>

Figure 2:
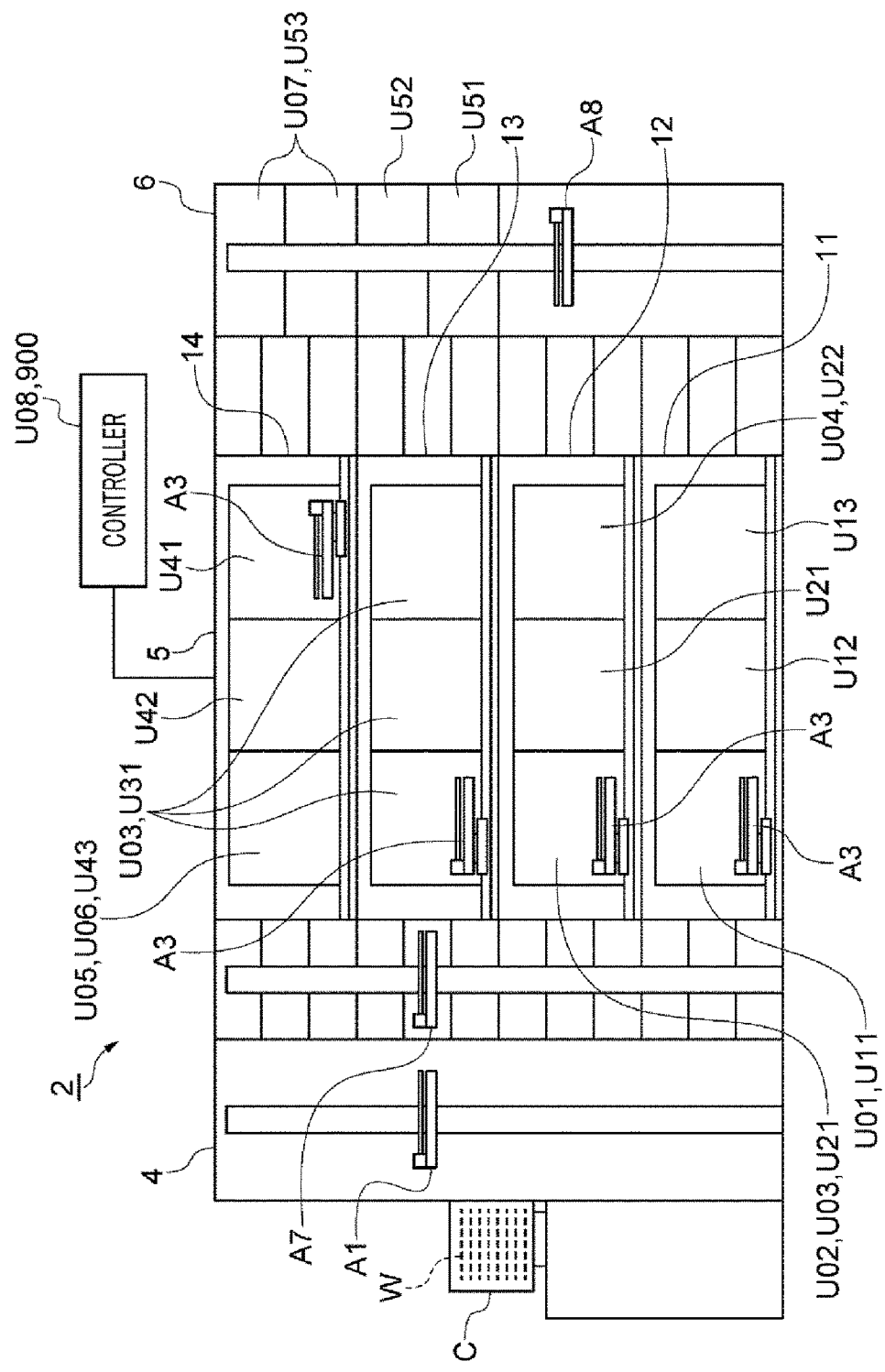
FIG. 2 is a cross sectional view taken along a line II-II of FIG. 1.

Hereinafter, a configuration of the coating and developing apparatus 2 as an example of a substrate processing apparatus will be explained. As depicted in FIG. 2, the coating and developing apparatus 2 includes a first protection processing unit U01 configured to form a first protective film on a peripheral portion of a wafer W; a film forming unit U02 configured to form a resist film containing a metal ("metal-containing resist film") on a surface of the wafer W; a first cleaning processing unit U03 configured to perform a cleaning processing of the peripheral portion of the wafer W on which the resist film is formed; a heat treatment unit U04 configured to heat the resist film; a developing processing unit U05 configured to perform a developing processing of the resist film; a second protection processing unit U07 configured to form a second protective film on the peripheral portion of the wafer W; a second cleaning processing unit U06 configured to perform a cleaning processing of the peripheral portion of the wafer W after being subjected to the developing processing of the resist film; and a control unit U08 configured to control these units.

To elaborate, the coating and developing apparatus 2 is equipped with a carrier block 4, a processing block 5, an interface block 6 and a controller 900.

(Carrier Block)

The carrier block 4 is configured to carry the wafer W into/from the coating and developing apparatus 2. For example, the carrier block 4 is configured to support a multiple number of carriers C for the wafers W and incorporates therein a delivery arm A1. Each carrier C is configured to accommodate therein, for example, a plurality of circular wafers W. The delivery arm A1 is configured to take out a wafer W from the carrier C, deliver the wafer W to the processing block 5, receive the wafer W from the processing block 5 and return the wafer W back into the carrier C.

(Processing Block)

The processing block 5 is equipped with a plurality of vertically arranged processing modules 11, 12, 13 and 14 and an elevation arm A7. The elevation arm A7 is configured to move the wafer W up and down between the processing modules 11, 12, 13 and 14.

The processing module 11 includes a liquid processing unit U11, a heat treatment unit U12, an inspecting unit U13 and a transfer arm A3 configured to transfer the wafer W into these units.

Figure 3:
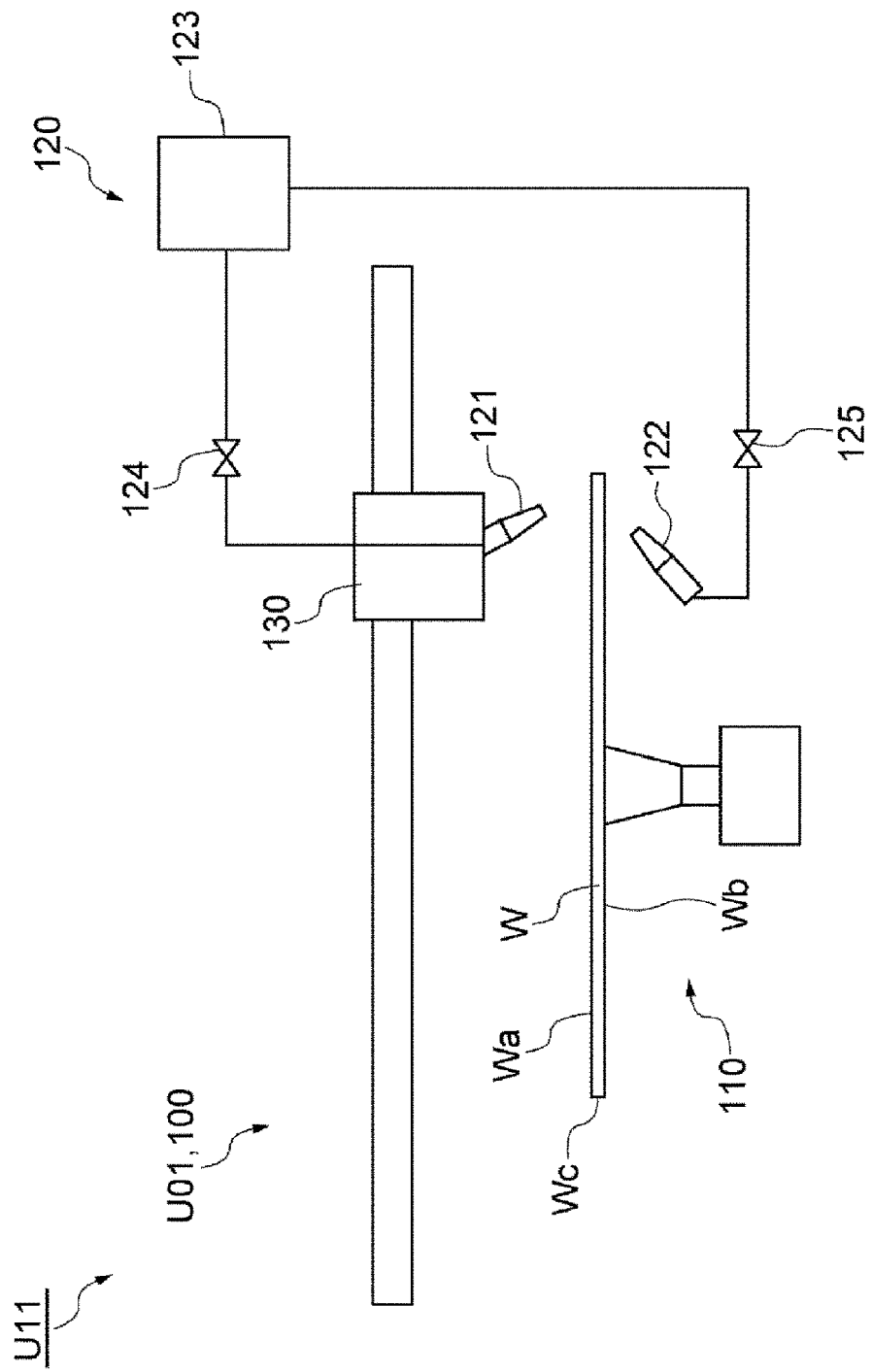
FIG. 3 is a schematic diagram of a liquid processing unit for protective film formation.

As illustrated in FIG. 3, the liquid processing unit U11 is equipped with a protection processing unit 100. The protection processing unit 100 serves as the aforementioned first protection processing unit U01 and is configured to supply a chemical liquid (hereinafter, referred to as "protection liquid") for forming the first protective film onto a peripheral portion Wc of the wafer W. A specific example of the first protective film may be, by way of example, but not limitation, an organic film of a phenol-based resin, a naphthalene-based resin, a polystyrene-based resin or a benzene-based resin. Although this film is formed through coating and heating of the chemical liquid as will be described later, the film before and after the heating will be referred to as "first protective film" hereinafter for the convenience of explanation.

The protection processing unit 100 is equipped with a rotating/holding unit 110, a liquid supply unit 120 and a nozzle position adjusting unit 130.

The rotating/holding unit 110 is configured to hold the wafer W horizontally placed by vacuum attraction or the like and rotate the wafer W around a vertical axis by using an electric motor or the like as a power source.

The liquid supply unit 120 is configured to supply the protection liquid onto the peripheral portion Wc of the wafer W held by the rotating/holding unit 110. The protection liquid contains an organic component as a source material such as, for example, the phenol-based resin, the naphthalene-based resin, the polystyrene-based resin or the benzene-based resin.

The liquid supply unit 120 is equipped with, by way of example, nozzles 121 and 122, a supply source 123 and valves 124 and 125. The nozzles 121 and 122 are configured to discharge the protection liquid onto the peripheral portion Wc of the wafer W. The nozzle 121 is placed above the peripheral portion Wc of the wafer W and opened downwards (for example, diagonally downwards toward an outer peripheral side of the wafer W). The nozzle 122 is placed under the peripheral portion Wc of the wafer W and opened upwards (for example, diagonally upwards toward the outer peripheral side of the wafer W). The supply source 123 stores therein the protection liquid to be supplied and force-feeds the protection liquid to the nozzles 121 and 122. The valves 124 and 125 are configured to open/close flow paths of the protection liquid from the supply source 123 to the nozzles 121 and 122, respectively. The valve 124 is implemented by, by way of example, an air operation valve and provided at a pipeline connecting the supply source 123 and the nozzle 121. The valve 125 is implemented by, by way of non-limiting example, an air operation valve and provided at a pipeline connecting the supply source 123 and the nozzle 122.

The nozzle position adjusting unit 130 is configured to adjust a position of the nozzle 121. To be more specific, the nozzle position adjusting unit 130 moves the nozzle 121 along a line, which crosses a space above the wafer W, by using an electric motor or the like as a power source.

Referring back to FIG. 2, the heat treatment unit U12 is configured to perform a heat treatment including a processing of heating the first protective film with a heat source such as a heating wire. The inspecting unit U13 is configured to acquire information for determining whether a formation state of the first protective film is normal. By way of example, the inspecting unit U13 acquires image information of at least a part of the first protective film with an imaging device.

The processing module 12 includes a liquid processing unit U21, a heat treatment unit U22 and a transfer arm A3 configured to transfer the wafer W into these units.

Figure 4:
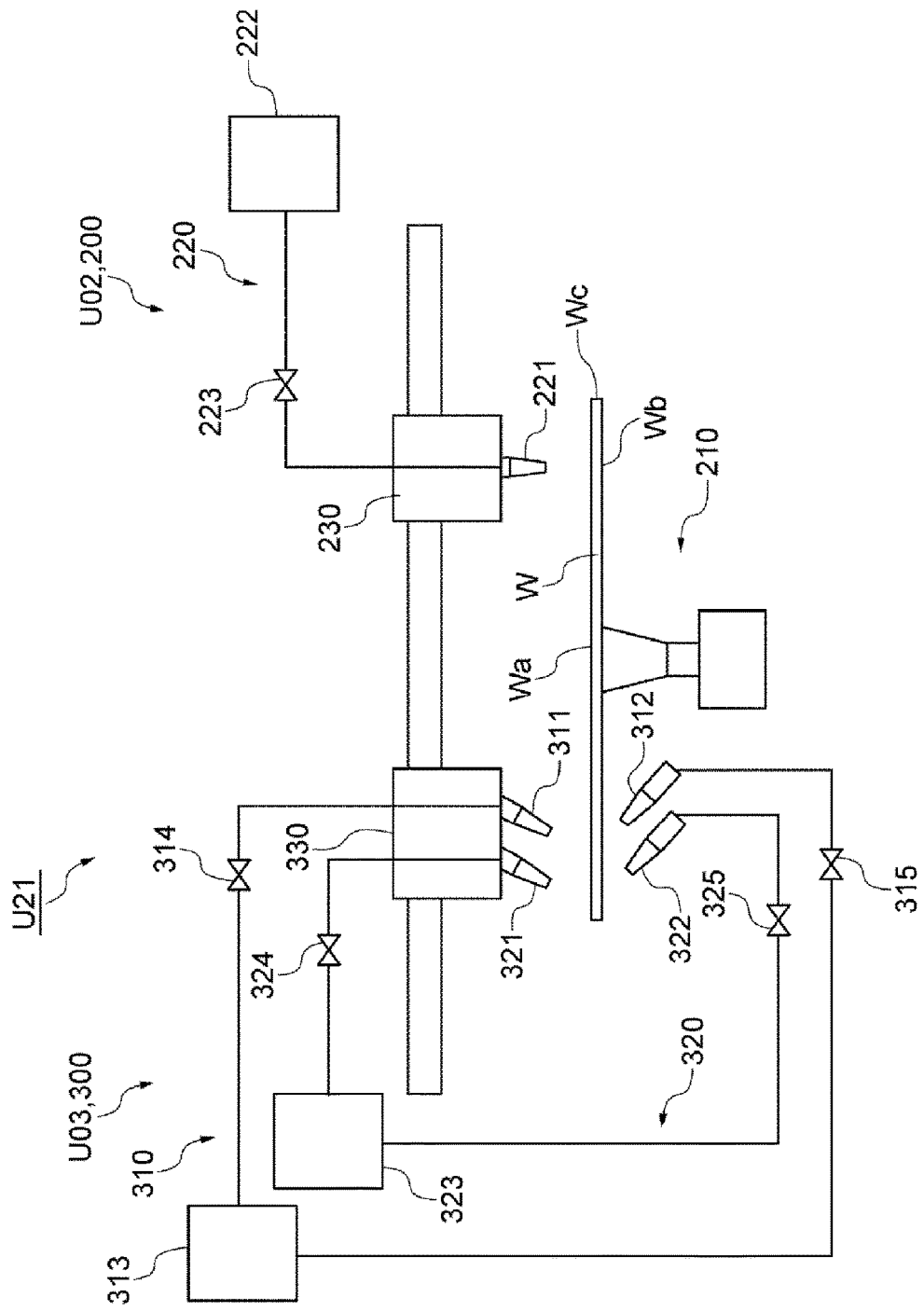
FIG. 4 is a schematic diagram of a liquid processing unit for film formation and cleaning.

As depicted in FIG. 4, the liquid processing unit U21 is equipped with a film forming unit 200 and a cleaning processing unit 300.

The film forming unit 200 serves as the aforementioned film forming unit U02 and is configured to supply a chemical liquid (hereinafter, referred to as "resist liquid") for forming an inorganic resist film containing a metal to the peripheral portion Wc of the wafer W. Although the resist film is formed through coating and heating of the chemical liquid as will be described later, the film before and after the heating will be referred to as "resist film" in the following description for the convenience of explanation.

The film forming unit 200 is equipped with a rotating/holding unit 210, a liquid supply unit 220 and a nozzle position adjusting unit 230.

The rotating/holding unit 210 is configured to hold the wafer W horizontally placed by vacuum attraction or the like and rotate the wafer W around a vertical axis by using an electric motor or the like as a power source.

The liquid supply unit 220 is configured to supply the resist liquid onto a front surface Wa of the wafer W held by the rotating/holding unit 210. The liquid supply unit 220 is equipped with, by way of example, a nozzle 221, a supply source 222 and a valve 223. The nozzle 221 is configured to discharge the resist liquid onto the front surface Wa of the wafer W. The nozzle 221 is placed above the wafer W and opened downwards (for example, vertically downwards). The supply source 222 stores therein the resist liquid to be supplied and force-feeds the resist liquid to the nozzle 221. The valve 223 is configured to open/close a flow path of the resist liquid from the supply source 222 to the nozzle 221. The valve 223 is implemented by, by way of example, an air operation valve and provided at a pipeline connecting the supply source 222 and the nozzle 221.

The nozzle position adjusting unit 230 is configured to adjust a position of the nozzle 221. To be more specific, the nozzle position adjusting unit 230 moves the nozzle 221 along a line, which crosses a space above the wafer W, by using an electric motor or the like as a power source.

The cleaning processing unit 300 serves as a part of the aforementioned first cleaning processing unit U03. The cleaning processing unit 300 is equipped with a liquid supply unit 310, a liquid supply unit 320 and a nozzle position adjusting unit 330.

The liquid supply unit 310 is configured to supply a first cleaning liquid (first chemical liquid) for removing the resist film to the peripheral portion Wc of the wafer W held by the rotating/holding unit 210. The first cleaning liquid may be, by way of example, but not limitation, an organic solvent such as propylene glycol monomethyl ether (PGME), Propylene glycol monomethyl ether acetate (PGMEA), or the like.

The liquid supply unit 310 is equipped with, by way of example, nozzles 311 and 312, a supply source 313 and valves 314 and 315. The nozzles 311 and 312 are configured to discharge the first cleaning liquid onto the peripheral portion Wc of the wafer W. The nozzle 311 is placed above the peripheral portion Wc of the wafer W and opened downwards (for example, diagonally downwards toward an outer peripheral side of the wafer W). The nozzle 312 is placed under the peripheral portion Wc of the wafer W and opened upwards (for example, diagonally upwards toward the outer peripheral side of the wafer W). The supply source 313 stores therein the first cleaning liquid to be supplied and force-feeds the first cleaning liquid to the nozzles 311 and 312. The valves 314 and 315 are configured to open/close flow paths of the first cleaning liquid from the supply source 313 into the nozzles 311 and 312, respectively. The valve 314 is implemented by, for example, an air operation valve and provided at a pipeline connecting the supply source 313 and the nozzle 311. The valve 315 is implemented by, for example, an air operation valve and provided at a pipeline connecting the supply source 313 and the nozzle 312.

The liquid supply unit 320 is configured to supply a second cleaning liquid (second chemical liquid) for removing the metal component to the peripheral portion Wc of the wafer W held by the rotating/holding unit 210. The second cleaning liquid has strong acidity as compared to the first cleaning liquid. As a specific example, the second cleaning liquid may be a mixed chemical liquid prepared by adding an acidic component to an organic solvent. A specific example of the acidic component may be acetic acid, citric acid, hydrochloric acid or sulfuric acid.

The liquid supply unit 320 is equipped with, by way of example, nozzles 321 and 322, a supply source 323 and valves 324 and 325. The nozzles 321 and 322 are configured to discharge the second cleaning liquid onto the peripheral portion Wc of the wafer W. The nozzle 321 is placed above the peripheral portion Wc of the wafer W and opened downwards (for example, diagonally downwards toward an outer peripheral side of the wafer W). The nozzle 322 is placed under the peripheral portion Wc of the wafer W and opened upwards (for example, diagonally upwards toward the outer peripheral side of the wafer W). The supply source 323 stores therein the second cleaning liquid to be supplied and force-feeds the second cleaning liquid to the nozzles 321 and 322. The valves 324 and 325 are configured to open/close flow paths of the second cleaning liquid from the supply source 323 into the nozzles 321 and 322, respectively. The valve 324 is implemented by, for example, an air operation valve and provided at a pipeline connecting the supply source 323 and the nozzle 321. The valve 325 is implemented by, for example, an air operation valve and provided at a pipeline connecting the supply source 323 and the nozzle 322.

The nozzle position adjusting unit 330 is configured to adjust positions of the nozzles 311 and 321. To be more specific, the nozzle position adjusting unit 330 moves the nozzles 311 and 321 along a line, which crosses the space above the wafer W, by using the electric motor or the like as the power source.

As stated above, the rotating/holding unit 210 is used when the liquid supply unit 310 supplies the first cleaning liquid to the peripheral portion Wc of the wafer W and, also, when the liquid supply unit 320 supplies the second cleaning liquid to the peripheral portion Wc of the wafer W. That is, the rotating/holding unit 210 also serves as a rotating/holding unit of the cleaning processing unit 300.

Referring back to FIG. 2, the heat treatment unit U22 serves as the aforementioned heat treatment unit U04 and is configured to perform a heat treatment including a processing of heating the resist film with a heat source such as a heating wire.

The processing module 13 includes a liquid processing unit U31 and a transfer arm A3 configured to transfer the wafer W into the liquid processing unit U31.

Figure 5:
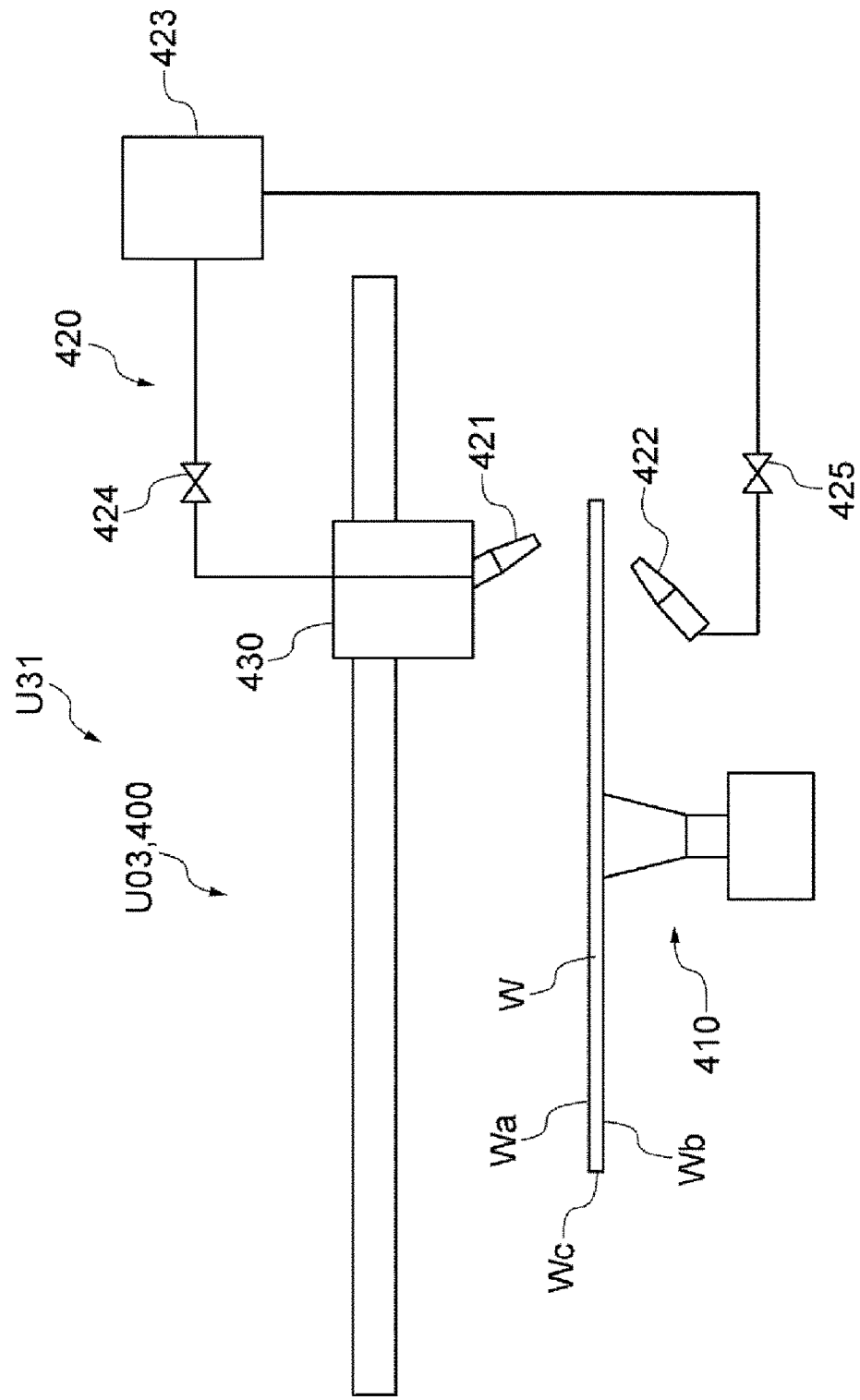
FIG. 5 is a schematic diagram of a liquid processing unit for protective film removal.

As depicted in FIG. 5, the liquid processing unit U31 is equipped with a cleaning processing unit 400. The cleaning processing unit 400 serves as a part of the aforementioned first cleaning processing unit U03 and is configured to supply a third cleaning liquid (third chemical liquid) for removing the first protective film to the peripheral portion Wc of the wafer W. The third cleaning liquid has weak acidity as compared to the second cleaning liquid (that is, the second cleaning liquid has strong acidity as compared to the third cleaning liquid). As a specific example, the third cleaning liquid may be, but not limited to, an organic solvent such as cyclohexanone, anisole, gamma-butyrolactone, or the like.

The cleaning processing unit 400 is equipped with a rotating/holding unit 410, a liquid supply unit 420 and a nozzle position adjusting unit 430.

The rotating/holding unit 410 is configured to hold the wafer W horizontally placed by vacuum attraction or the like and rotate the wafer W around a vertical axis by using an electric motor or the like as a power source.

The liquid supply unit 420 is configured to supply the third cleaning liquid onto the peripheral portion Wc of the wafer W held by the rotating/holding unit 410. The liquid supply unit 420 is equipped with, by way of example, nozzles 421 and 422, a supply source 423 and valves 424 and 425. The nozzles 421 and 422 are configured to discharge the third cleaning liquid onto the peripheral portion Wc of the wafer W. The nozzle 421 is placed above the peripheral portion Wc of the wafer W and opened downwards (for example, diagonally downwards toward an outer peripheral side of the wafer W). The nozzle 422 is placed under the peripheral portion Wc of the wafer W and opened upwards (for example, diagonally upwards toward the outer peripheral side of the wafer W). The supply source 423 stores therein the third cleaning liquid to be supplied and force-feeds the third cleaning liquid to the nozzles 421 and 422. The valves 424 and 425 are configured to open/close flow paths of the third cleaning liquid from the supply source 423 to the nozzles 421 and 422, respectively. The valve 424 is implemented by, by way of example, an air operation valve and provided at a pipeline connecting the supply source 423 and the nozzle 421. The valve 425 is implemented by, for example, an air operation valve and provided at a pipeline connecting the supply source 423 and the nozzle 422.

The nozzle position adjusting unit 430 is configured to adjust a position of the nozzle 421. To be more specific, the nozzle position adjusting unit 430 moves the nozzle 421 along a line, which crosses a space above the wafer W, by using an electric motor or the like as a power source.

Referring back to FIG. 2, the processing module 14 is configured to perform, after the exposure processing of the resist film, a processing on the wafer W on which the second protective film to be described later is formed. The processing module 14 includes a heat treatment unit U41, an inspecting unit U42, a liquid processing unit U43 and a transfer arm A3 configured to transfer the wafer W into these units.

The heat treatment unit U41 is configured to perform a heat treatment including a processing of heating the resist film and the second protective film with a heat source such as a heating wire. The inspecting unit U42 is configured to acquire information for determining whether a formation state of the second protective film is normal. By way of example, the inspecting unit U42 acquires image information of at least a part of the second protective film with an imaging device.

Figure 6:
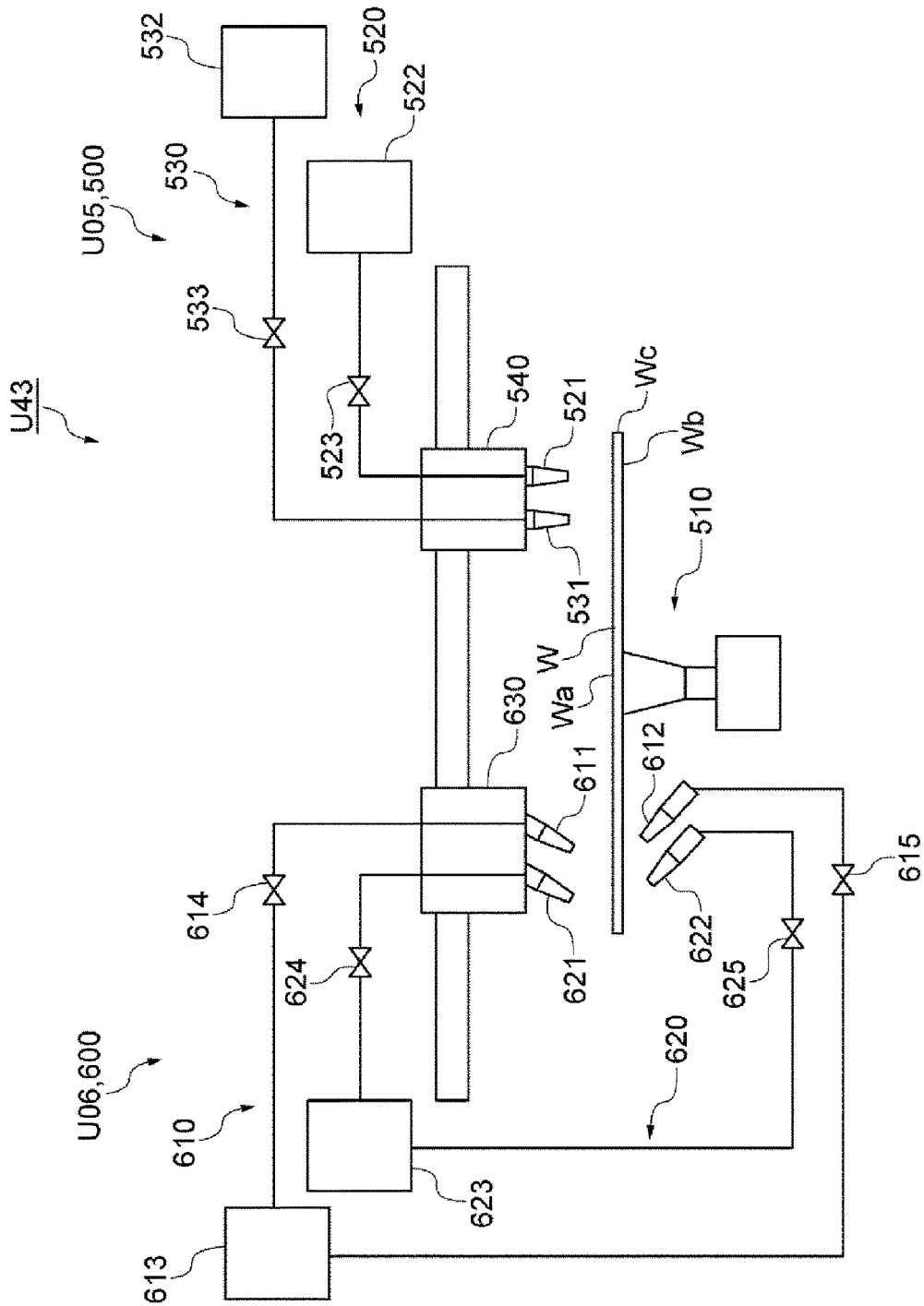
FIG. 6 is a schematic diagram of a liquid processing unit for development and cleaning.

As depicted in FIG. 6, the liquid processing unit U43 is equipped with a developing processing unit 500 and a cleaning processing unit 600. The developing processing unit 500 serves as the aforementioned developing processing unit U05 and is configured to perform a developing processing of the resist film. The developing processing unit 500 is equipped with a rotating/holding unit 510, liquid supply units 520 and 530 and a nozzle position adjusting unit 540.

The rotating/holding unit 510 is configured to hold the wafer W horizontally placed by vacuum attraction or the like and rotate the wafer W around a vertical axis by using an electric motor or the like as a power source.

The liquid supply unit 520 is configured to supply a chemical liquid (hereinafter, referred to as "developing liquid") for the developing processing onto the front surface Wa of the wafer W held by the rotating/holding unit 510. The liquid supply unit 520 is equipped with, by way of example, a nozzle 521, a supply source 522 and a valve 523. The nozzle 521 is configured to discharge the developing liquid onto the front surface Wa of the wafer W. The nozzle 521 is placed above the wafer W and opened downwards (for example, vertically downwards). The supply source 522 stores therein the developing liquid to be supplied and force-feeds the developing liquid to the nozzle 521. The valve 523 is configured to open/close a flow path of the developing liquid from the supply source 522 to the nozzle 521. The valve 523 is implemented by, by way of example, an air operation valve and provided at a pipeline connecting the supply source 522 and the nozzle 521.

The liquid supply unit 530 supplies a liquid (hereinafter, referred to as "rinse liquid") for washing away the developing liquid onto the front surface Wa of the wafer W held by the rotating/holding unit 510. The liquid supply unit 530 is equipped with, by way of example, a nozzle 531, a supply source 532 and a valve 533. The nozzle 531 is configured to discharge the rinse liquid to the front surface Wa of the wafer W. The nozzle 531 is placed above the wafer W and opened downwards (for example, vertically downwards). The supply source 532 stores therein the rinse liquid to be supplied and force-feeds the rinse liquid to the nozzle 531. The valve 533 is configured to open/close a flow path of the rinse liquid from the supply source 532 into the nozzle 531. The valve 533 is implemented by, by way of non-limiting example, an air operation valve and provided at a pipeline connecting the supply source 532 and the nozzle 531.

The nozzle position adjusting unit 540 is configured to adjust positions of the nozzles 521 and 531. To be more specific, the nozzle position adjusting unit 540 moves the nozzles 521 and 531 along a line, which crosses a space above the wafer W, by using an electric motor or the like as a power source.

The cleaning processing unit 600 serves the aforementioned second cleaning processing unit U06. The cleaning processing unit 600 is equipped with a liquid supply unit 610, a liquid supply unit 620 and a nozzle position adjusting unit 630.

The liquid supply unit 610 is configured to supply a fourth cleaning liquid (fourth chemical liquid) for removing the metal component to the peripheral portion Wc of the wafer W held by the rotating/holding unit 510. The fourth cleaning liquid may be, by way of example, but not limitation, a chemical liquid prepared by mixing an acidic component to an organic solvent. A specific example of the acidic component may be acetic acid, citric acid, hydrochloric acid or sulfuric acid.

The liquid supply unit 610 is equipped with, by way of example, nozzles 611 and 612, a supply source 613 and valves 614 and 615. The nozzles 611 and 612 are configured to discharge the fourth cleaning liquid onto the peripheral portion Wc of the wafer W. The nozzle 611 is placed above the peripheral portion Wc of the wafer W and opened downwards (for example, diagonally downwards toward an outer peripheral side of the wafer W). The nozzle 612 is placed under the peripheral portion Wc of the wafer W and opened upwards (for example, diagonally upwards toward the outer peripheral side of the wafer W). The supply source 613 stores therein the fourth cleaning liquid to be supplied and force-feeds the fourth cleaning liquid to the nozzles 611 and 612. The valves 614 and 615 are configured to open/close flow paths of the fourth cleaning liquid from the supply source 613 into the nozzles 611 and 612, respectively. The valve 614 is implemented by, for example, an air operation valve and provided at a pipeline connecting the supply source 613 and the nozzle 611. The valve 615 is implemented by, for example, an air operation valve and provided at a pipeline connecting the supply source 613 and the nozzle 612.

The liquid supply unit 620 is configured to supply a fifth cleaning liquid (fifth chemical liquid) for removing the second protective film to the front surface Wa of the wafer W held by the rotating/holding unit 510. The fifth cleaning liquid has weak acidity as compared to the fourth cleaning liquid (that is, the fourth cleaning liquid has strong acidity as compared to the fifth cleaning liquid). As a specific example, the fifth cleaning liquid may be, but not limitation, an organic solvent such as cyclohexanone, anisole, gamma-butyrolactone, or the like.

The liquid supply unit 620 is equipped with, by way of example, nozzles 621 and 622, a supply source 623 and valves 624 and 625. The nozzles 621 and 622 are configured to discharge the fifth cleaning liquid onto the peripheral portion Wc of the wafer W. The nozzle 621 is placed above the peripheral portion Wc of the wafer W and opened downwards (for example, diagonally downwards toward an outer peripheral side of the wafer W). The nozzle 622 is placed under the peripheral portion Wc of the wafer W and opened upwards (for example, diagonally upwards toward the outer peripheral side of the wafer W). The supply source 623 accommodates therein the fifth cleaning liquid to be supplied and force-feeds the fifth cleaning liquid to the nozzles 621 and 622. The valves 624 and 625 are configured to open/close flow paths of the fifth cleaning liquid from the supply source 623 into the nozzles 621 and 622, respectively. The valve 624 is implemented by, for example, an air operation valve and provided at a pipeline connecting the supply source 623 and the nozzle 621. The valve 625 is implemented by, for example, an air operation valve and provided at a pipeline connecting the supply source 623 and the nozzle 622.

The nozzle position adjusting unit 630 is configured to adjust positions of the nozzles 611 and 621. To be more specific, the nozzle position adjusting unit 630 moves the nozzles 611 and 621 along a line, which crosses the space above the wafer W, by using an electric motor or the like as a power source.

As stated above, the rotating/holding unit 510 is used when the liquid supply unit 610 supplies the fourth cleaning liquid to the peripheral portion Wc of the wafer W and, also, when the liquid supply unit 620 supplies the fifth cleaning liquid to the peripheral portion Wc of the wafer W. That is, the rotating/holding unit 510 also serves as a rotating/holding unit of the cleaning processing unit 600.

(Interface Block)

Referring back to FIG. 2, the interface block 6 is configured to transfer the wafer W between the processing block 5 and the exposure apparatus 3. By way of example, the interface block 6 is equipped with a rear surface cleaning unit U51, a rear surface inspecting unit U52, a liquid processing unit U53 and a delivery arm A8. The delivery arm A8 is configured to transfer the wafer W between the processing block 5 and the exposure apparatus 3 while passing through the rear surface cleaning unit U51, the rear surface inspecting unit U52 and the liquid processing unit U53.

The rear surface cleaning unit U51 is configured to clean a rear surface Wb of the wafer W. The rear surface inspecting unit U52 is configured to acquire information for determining whether a foreign substance or the like adheres to the rear surface Wb of the wafer W. By way of non-limiting example, the rear surface inspecting unit U52 acquires image information of at least a part of the rear surface Wb with an imaging device.

Figure 7:
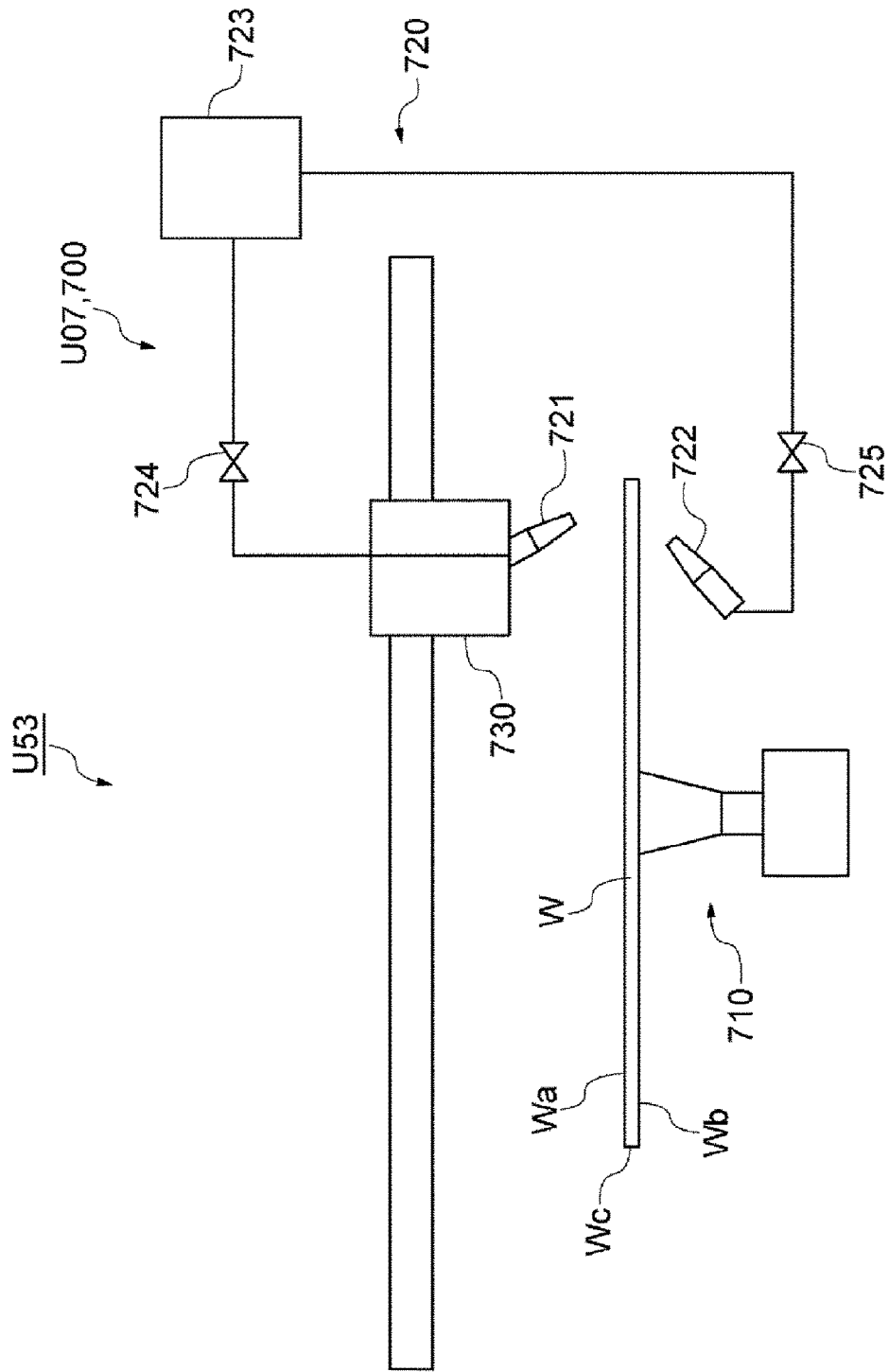
FIG. 7 is a schematic diagram of a liquid processing unit for protective film formation.

As depicted in FIG. 7, the liquid processing unit U53 is equipped with a protection processing unit 700. The protection processing unit 700 serves as the aforementioned second protection processing unit U07 and is configured to supply a chemical liquid (hereinafter, referred to as "protection liquid") for forming the second protective film to the peripheral portion Wc of the wafer W. As a specific example, the second protective film may be, by way of example, but not limitation, an organic film of a phenol-based resin, a naphthalene-based resin, a polystyrene-based resin or a benzene-based resin. Although this film is formed through coating and heating of the chemical liquid, the film before and after the heating will be referred to as "second protective film" in the following description for the convenience of explanation.

The protection processing unit 700 has the same configuration as the above-described protection processing unit 100. That is, the protection processing unit 700 includes a rotating/holding unit 710, a liquid supply unit 720 and a nozzle position adjusting unit 730 which are the same as the rotating/holding unit 110, the liquid supply unit 120 and the nozzle position adjusting unit 130, respectively. The liquid supply unit 720 is equipped with nozzles 721 and 722, a supply source 723 and valves 724 and 725 which are the same as the nozzles 121 and 122, the supply source 123 and the valves 124 and 125, respectively.

(Controller)

Referring back to FIG. 2, the controller 900 controls the carrier block 4, the processing block 5 and the interface block 6, and serves as the aforementioned control unit U08.

The controller 900 is configured to control the first protection processing unit U01 to form the first protective film on the peripheral portion Wc of the wafer W; control the film forming unit U02 to form the resist film on the front surface Wa of the wafer W on which the first protective film is formed; control the first cleaning processing unit U03 to supply the first cleaning liquid to the peripheral portion Wc of the wafer W on which the resist film is formed; control the first cleaning processing unit U03 to supply the second cleaning liquid to the peripheral portion Wc of the wafer W after the first cleaning liquid is supplied to the corresponding peripheral portion Wc; and control the first cleaning processing unit U03 to supply the third cleaning liquid to the peripheral portion Wc of the wafer W after the second cleaning liquid is supplied to the corresponding peripheral portion Wc.

The controller 900 may be configured to additionally control the first cleaning processing unit U03 to supply the first cleaning liquid to the peripheral portion Wc of the wafer W after the second cleaning liquid is supplied to the corresponding peripheral portion Wc and before the third cleaning liquid is supplied to the corresponding peripheral portion Wc, or may be configured to additionally control the heat treatment unit U04 to heat the resist film of the wafer W after the first cleaning liquid is supplied to the peripheral portion Wc of the wafer W and before the third cleaning liquid is supplied to the corresponding peripheral portion Wc.

Further, the controller 900 may be configured to additionally control the second protection processing unit U07 to form the second protective film on the peripheral portion Wc of the wafer W after the third cleaning liquid is supplied to the corresponding peripheral portion Wc; control the developing processing unit U05 to perform the developing processing of the resist film of the wafer W on which the second protective film is formed; control the second cleaning processing unit U06 to supply the fourth cleaning liquid to the peripheral portion Wc of the wafer W after being subjected to the developing processing of the resist film; and control the second cleaning processing unit U06 to supply the fifth cleaning liquid to the peripheral portion Wc of the wafer W after the fourth cleaning liquid is supplied to the corresponding peripheral portion Wc.

Figure 8:
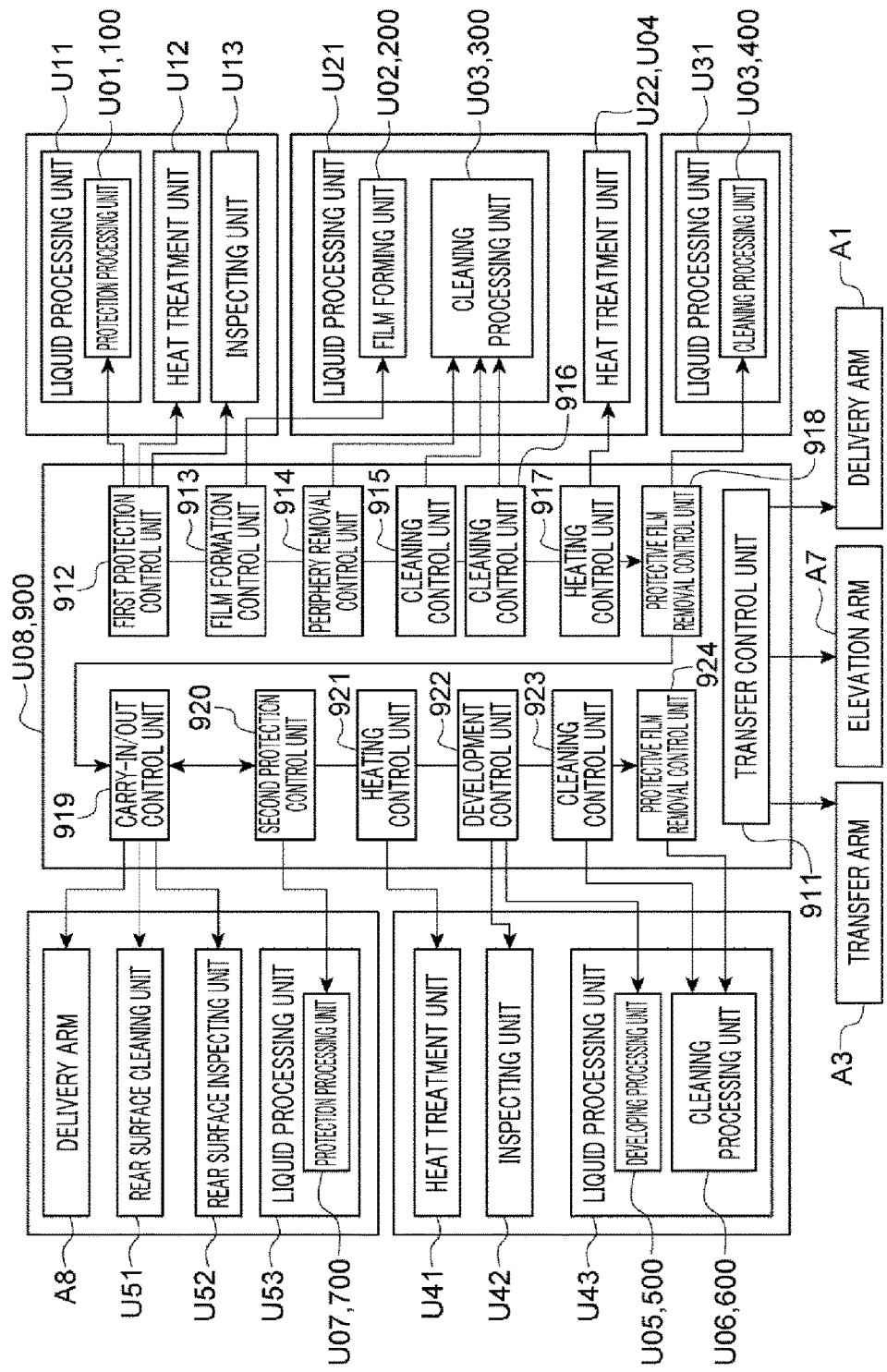
FIG. 8 is a block diagram illustrating a functional configuration of a controller.

Now, a specific configuration of the controller 900 will be explained. As illustrated in FIG. 8, the controller 900 has, as functional components (hereinafter, referred to as "functional modules"), a transfer control unit 911, a first protection control unit 912, a film formation control unit 913, a periphery removal control unit 914, a cleaning control unit 915, a cleaning control unit 916, a heating control unit 917, a protective film removal control unit 918, a carry-in/out control unit 919, a second protection control unit 920, a heating control unit 921, a development control unit 922, a cleaning control unit 923 and a protective film removal control unit 924.

The transfer control unit 911 controls the delivery arm A1 and the transfer arms A3 to transfer the wafer W.

The first protection control unit 912 controls the protection processing unit 100, the heat treatment unit U12 and the inspecting unit U13 to form the first protective film on the peripheral portion Wc of the wafer W.

The film formation control unit 913 controls the film forming unit 200 to form the resist film on the front surface Wa of the wafer W on which the first protective film is formed.

The periphery removal control unit 914 controls the cleaning processing unit 300 to supply the first cleaning liquid to the peripheral portion Wc of the wafer W on which the resist film is formed.

The cleaning control unit 915 controls the cleaning processing unit 300 to supply the second cleaning liquid to the peripheral portion Wc of the wafer W after the first cleaning liquid is supplied to the corresponding peripheral portion Wc.

The cleaning control unit 916 controls the cleaning processing unit 300 to supply the first cleaning liquid to the peripheral portion Wc of the wafer W after the second cleaning liquid is supplied to the corresponding peripheral portion Wc.

The heating control unit 917 controls the heat treatment unit U22 to heat the resist film of the wafer W after the first cleaning liquid is supplied to the peripheral portion Wc of the wafer W.

The protective film removal control unit 918 controls the cleaning processing unit 400 to supply the third cleaning liquid to the peripheral portion Wc of the wafer W after the resist film of the wafer W is heated by the heat treatment unit U22.

The carry-in/out control unit 919 controls the delivery arm A8 to carry the wafer W into the exposure apparatus 3 after the third cleaning liquid is supplied to the peripheral portion Wc of the wafer W and to receive the wafer W after being subjected to the exposure processing from the exposure apparatus 3.

The second protection control unit 920 controls the protection processing unit 700 to form the second protective film on the peripheral portion Wc of the wafer W received from the exposure apparatus 3 by the delivery arm A8.

The heating control unit 921 controls the heat treatment unit U41 to heat the resist film of the wafer W on which the second protective film is formed.

The development control unit 922 controls the developing processing unit 500 to perform the developing processing on the resist film of the wafer W after the corresponding resist film is heated by the heat treatment unit U41.

The cleaning control unit 923 controls the cleaning processing unit 600 to supply the fourth cleaning liquid to the peripheral portion Wc of the wafer W on which the developing processing of the resist film is performed.

The protective film removal control unit 924 controls the cleaning processing unit 600 to supply the fifth cleaning liquid to the peripheral portion Wc of the wafer W after the fourth cleaning liquid is supplied to the corresponding peripheral portion Wc.

Figure 9:
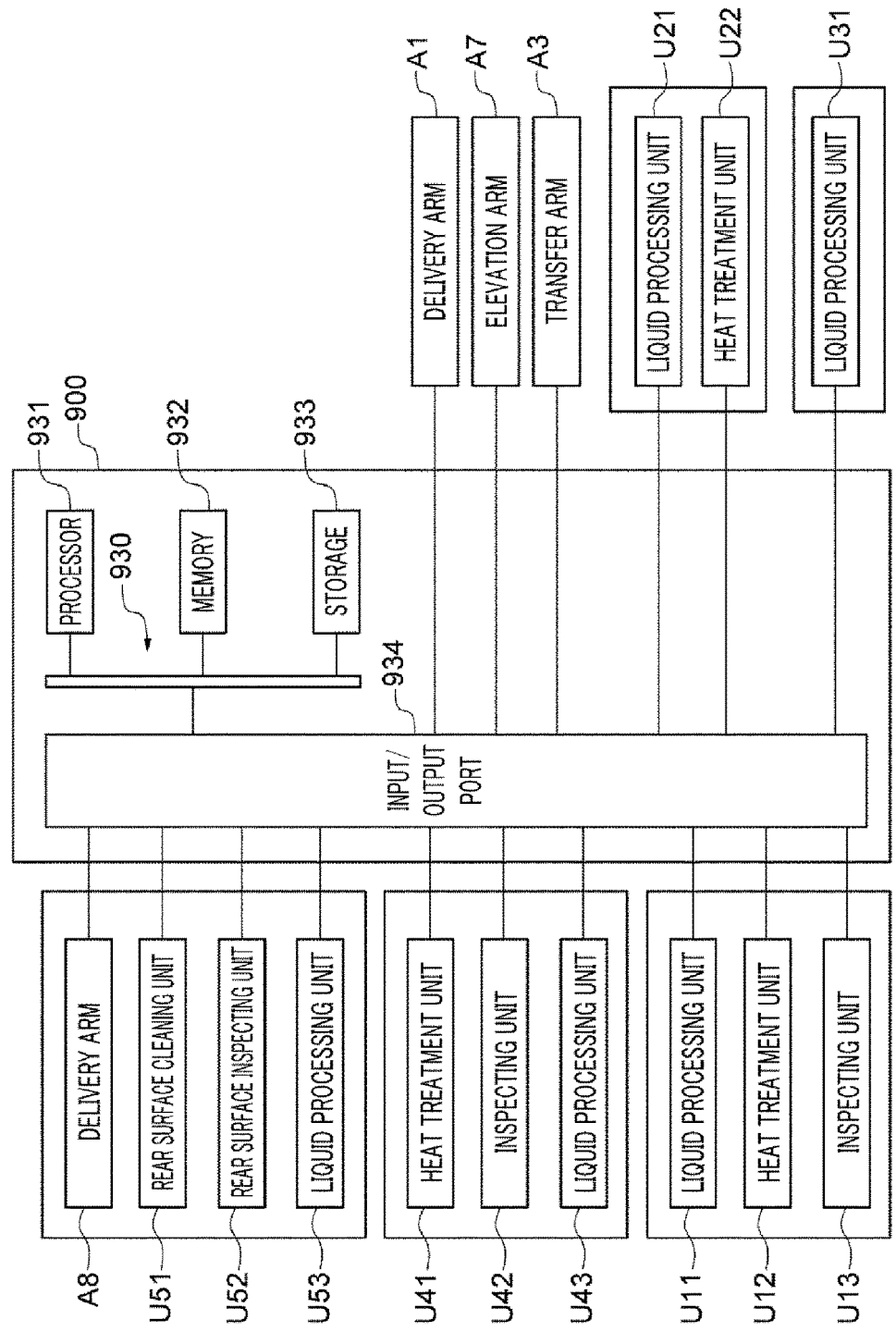
FIG. 9 is a block diagram illustrating a hardware configuration of the controller.

The controller 900 is composed of one or more control computers. By way of example, the controller 900 is equipped with a circuit 930 shown in FIG. 9. The circuit 930 includes one or more processors 931, a memory 932, a storage 933, and an input/output port 934.

The storage 933 is a recording medium which stores therein programs for implementing a substrate processing method to be described later in the coating and developing apparatus 2. By way of example, the storage 933 stores programs for constituting the aforementioned individual functional modules. The storage 933 may be a recording medium of any of various types as long as it is computer-readable. As a specific example, the storage 933 may be implemented by a hard disk, a non-volatile semiconductor memory, a magnetic disk, an optical disk, or the like. The memory 932 temporarily stores thereon the programs loaded from the storage 933 and operation results by the processor 931. The processor 931 constitutes the individual functional modules by executing the programs in cooperation with the memory 932.

The input/output port 934 is configured to perform an input and an output of an electric signal between the individual constituent components of the carrier block 4, the processing block 5 and the interface block 6 in response to an instruction from the processor 931.

Further, the hardware configuration of the controller 900 is not limited to constituting the individual functional modules by the programs. For example, at least a part of the functional modules of the controller 900 may be implemented by a dedicated logical circuit or an ASIC (Application Specific Integrated Circuit) which is an integration of the logical circuits.

<Substrate Processing Method>

Now, a control sequence by the controller 900 as an example of the substrate processing method will be elaborated.

(Outline)

Figure 10:
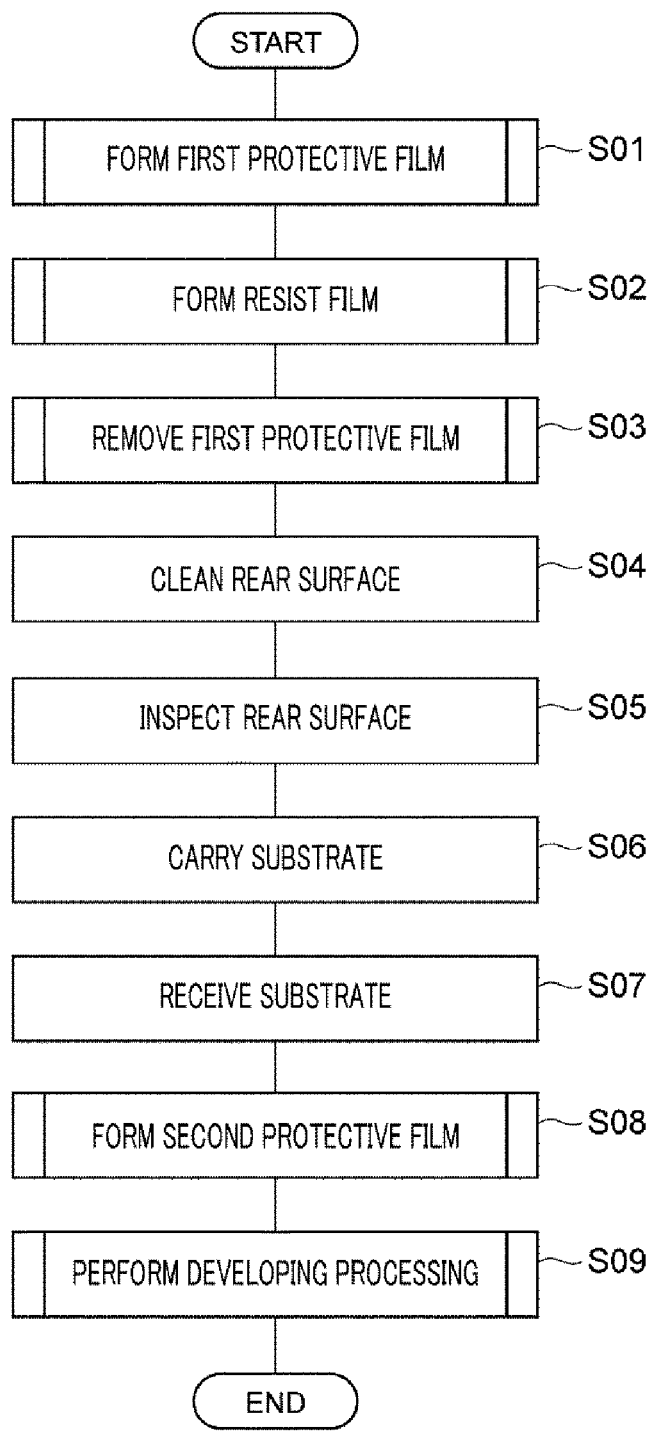
FIG. 10 is a flowchart for describing a sequence of a substrate processing.

As shown in FIG. 10, the controller 900 first performs a process S01. The process S01 includes controlling the liquid processing unit U11, the heat treatment unit U12 and the inspecting unit U13 to form the first protective film on the peripheral portion Wc of the wafer W. More specific content of this processing will be described later.

Then, the controller 900 performs a process S02. The process S02 includes controlling the film forming unit 200 of the liquid processing unit U21 to form the resist film on the front surface Wa of the wafer W on which the first protective film is formed; controlling the cleaning processing unit 300 of the liquid processing unit U21 to supply the first cleaning liquid to the peripheral portion Wc of the corresponding wafer W; controlling the cleaning processing unit 300 of the liquid processing unit U21 to supply the second cleaning liquid to the peripheral portion Wc of the corresponding wafer W; and controlling the cleaning processing unit 300 of the liquid processing unit U21 to supply the first cleaning liquid again to the peripheral portion Wc of the corresponding wafer W. More specific content of the processing will be described later.

Next, the controller 900 performs a process S03. The process S03 includes controlling the liquid processing unit U31 to supply the third cleaning liquid to the peripheral portion Wc of the wafer W. More specific content of the processing will be described later.

Thereafter, the controller 900 performs a process S04. In the process S04, the carry-in/out control unit 919 controls the delivery arm A8 to carry the wafer W taken out of the liquid processing unit U31 into the rear surface cleaning unit U51, and controls the rear surface cleaning unit U51 to clean the rear surface Wb of the wafer W.

Subsequently, the controller 900 performs a process S05. In the process S05, the carry-in/out control unit 919 controls the delivery arm A8 to take out the wafer W from the rear surface cleaning unit U51 and carry the taken wafer W into the rear surface inspecting unit U52, and the rear surface inspecting unit U52 is controlled to acquire image information of the rear surface Wb of the wafer W and to determine whether there is a foreign substance adhering to the rear surface Wb based on the image information acquired by the rear surface inspecting unit U52.

Afterwards, the controller 900 performs a process S06. In the process S06, the carry-in/out control unit 919 controls the delivery arm A8 to take out the wafer W from the rear surface inspecting unit U52 and carry the taken wafer W into the exposure apparatus 3.

Then, the controller 900 performs a process S07. In the process S07, the carry-in/out control unit 919 controls the delivery arm A8 to receive the wafer W on which the exposure processing of the resist film is performed by the exposure apparatus 3.

Next, the controller 900 performs a process S08. The process S08 includes controlling the liquid processing unit U53 to form the second protective film on the peripheral portion Wc of the wafer W received from the exposure apparatus 3 by the delivery arm A8. More specific content of the processing will be described later.

Thereafter, the controller 900 performs a process S09. The process S09 includes controlling the heat treatment unit U41 to heat the resist film of the wafer W on which the second protective film is formed; controlling the developing processing unit 500 of the liquid processing unit U43 to perform the developing processing on the resist film of the corresponding wafer W; controlling the cleaning processing unit 600 of the liquid processing unit U43 to supply the fourth cleaning liquid to the peripheral portion Wc of the corresponding wafer W; and controlling the cleaning processing unit 600 of the liquid processing unit U43 to supply the fifth cleaning liquid to the corresponding peripheral portion Wc of the corresponding wafer W. More specific content of the processing will be described later. Through these processes, the control sequence by the controller 900 is completed.

(Sequence of Protective Film Formation)

Figure 11:
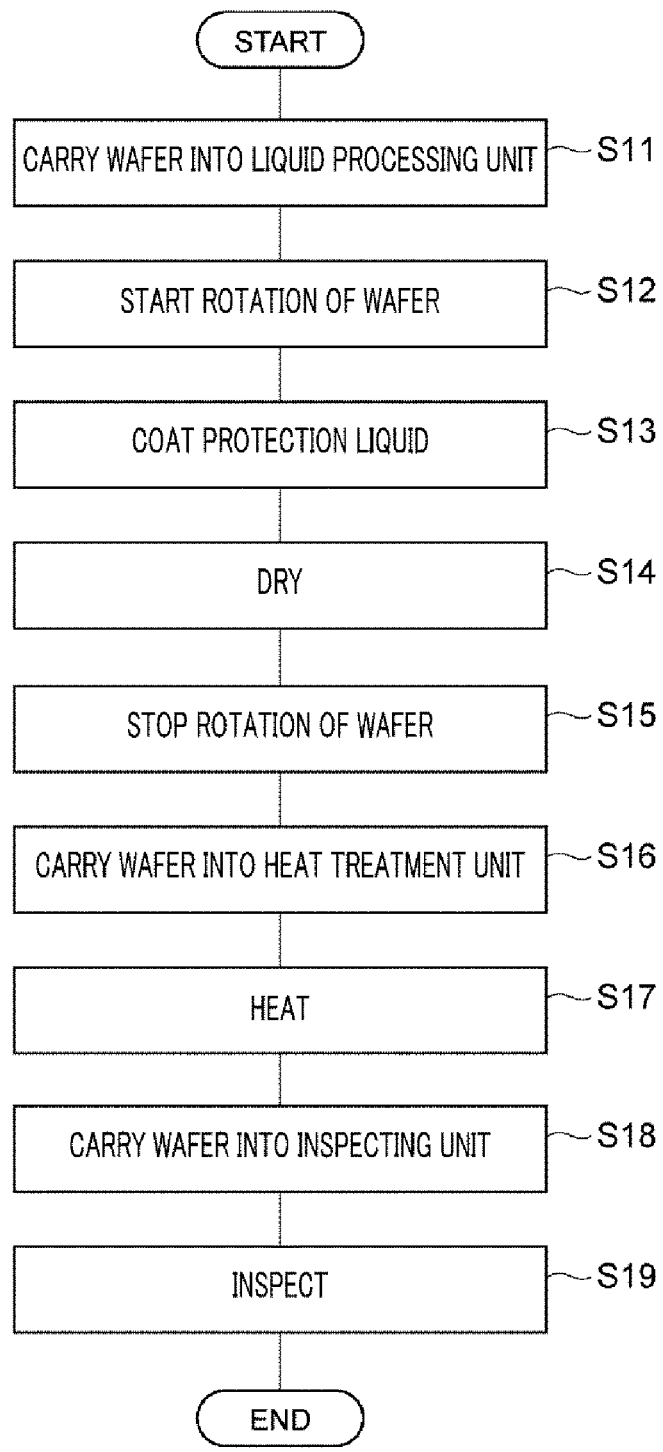
FIG. 11 is a flowchart for describing a sequence of the protective film formation.

Now, the specific content of the processing of the process S01 will be explained. As shown in FIG. 11, the controller 900 first performs a process S11. In the process S11, the transfer control unit 911 controls the delivery arm A1 to take out the wafer W from the carrier C and carry the taken wafer W into the processing module 11, controls the transfer arm A3 of the processing module 11 to carry the corresponding wafer W into the liquid processing unit U11 and controls the rotating/holding unit 110 to hold the corresponding wafer W.

Then, the controller 900 performs a process S12. In the process S12, the first protection control unit 912 controls the rotating/holding unit 110 to start the rotation of the wafer W.

Figure 12:
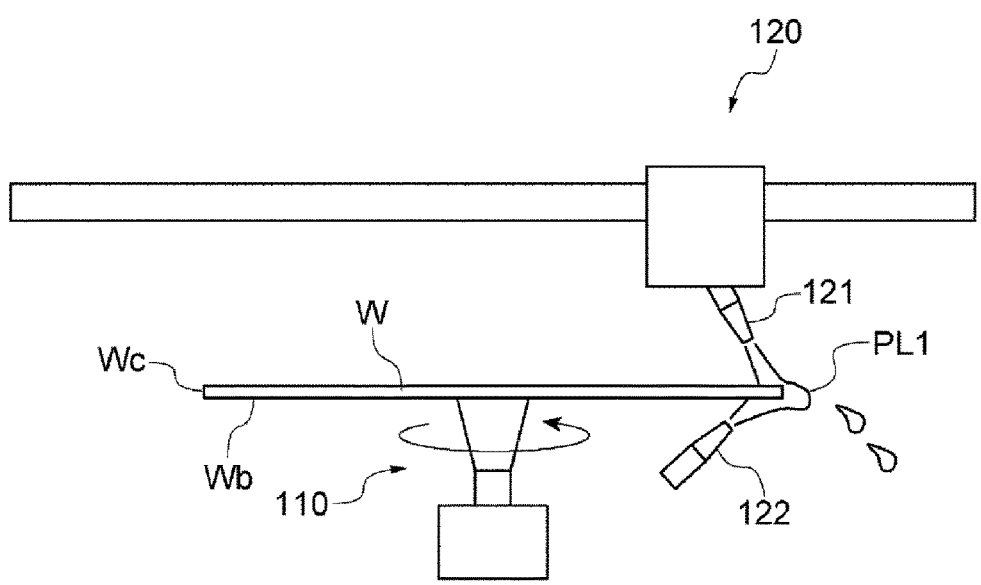
FIG. 12 is a schematic diagram illustrating the liquid processing unit which is forming a protective film.

Thereafter, the controller 900 performs a process S13. In the process S13, the first protection control unit 912 controls the nozzle position adjusting unit 130 to place the nozzle 121 above the peripheral portion Wc of the wafer W held by the rotating/holding unit 110, and then controls the liquid supply unit 120 to open the valves 124 and 125 to start a discharge of a protection liquid PL1 from the nozzles 121 and 122 (see FIG. 12). Accordingly, the protection liquid PL1 is supplied to the peripheral portion Wc of the wafer W being rotated from thereabove and thereunder, so that a liquid film of the protection liquid PL1 is formed on the corresponding peripheral portion Wc. Thereafter, the first protection control unit 912 controls the liquid supply unit 120 to close the valves 124 and 125 to stop the discharge of the protection liquid PL1 from the nozzles 121 and 122.

Figure 13:
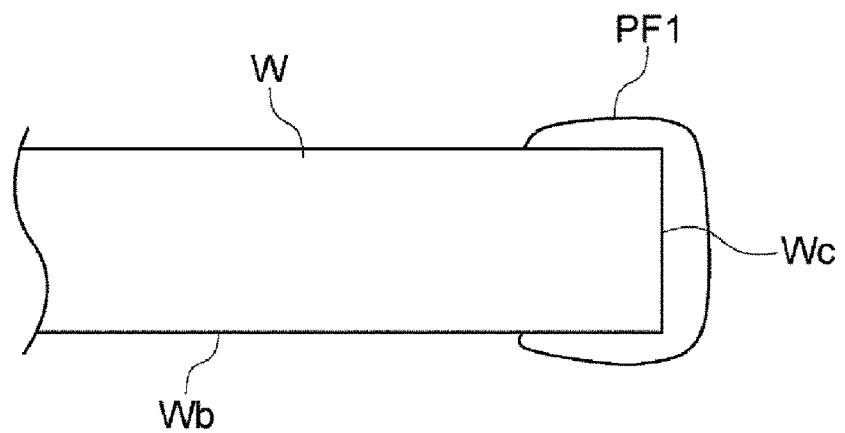
FIG. 13 is a schematic diagram illustrating a peripheral portion of a wafer after the protective film is formed.

Subsequently, the controller 900 performs a process S14. In the process S14, the first protection control unit 912 continues the rotation of the wafer W by the rotating/holding unit 110 and waits for the drying (the volatilization of the solvent) of the protection liquid PL1 on the peripheral portion Wc. Accordingly, a first protection film PF1 is formed on the peripheral portion Wc of the wafer W (see FIG. 13).

Then, the controller 900 performs a process S15. In the process S15, the first protection control unit 912 controls the rotating/holding unit 110 to stop the rotation of the wafer W.

Thereafter, the controller 900 performs a process S16. In the process S16, the transfer control unit 911 controls the transfer arm A3 to take out the wafer W from the liquid processing unit U11 and carry the taken wafer W into the heat treatment unit U12.

Afterwards, the controller 900 performs a process S17. In the process S17, the first protection control unit 912 controls the heat treatment unit U12 to heat the wafer W. Along with the heating of the wafer W, the first protective film PF1 formed on the peripheral portion Wc of the wafer W is heated. Accordingly, a cross-linking reaction or the like on the first protective film PF1 is accelerated, so that strength of the first protective film PF1 is improved.

Then, the controller 900 performs a process S18. In the process S18, the transfer control unit 911 controls the transfer arm A3 to take out the wafer W from the heat treatment unit U12 and carry the taken wafer W into the inspecting unit U13.

Thereafter, the controller 900 performs a process S19. In the process S19, the first protection control unit 912 controls the inspecting unit U13 to acquire image information of the first protective film PF1 formed on the peripheral portion Wc of the wafer W, and determines whether a formation state of the first protective film PF1 is normal based on the image information acquired by the inspecting unit U13. After the image information of the first protective film PF1 is acquired by the inspecting unit U13, the transfer control unit 911 controls the transfer arm A3 to take out the wafer W from the inspecting unit U13. Through these processes, the process S01 is completed.

(Sequence of Film Formation and Cleaning)

Figure 14:
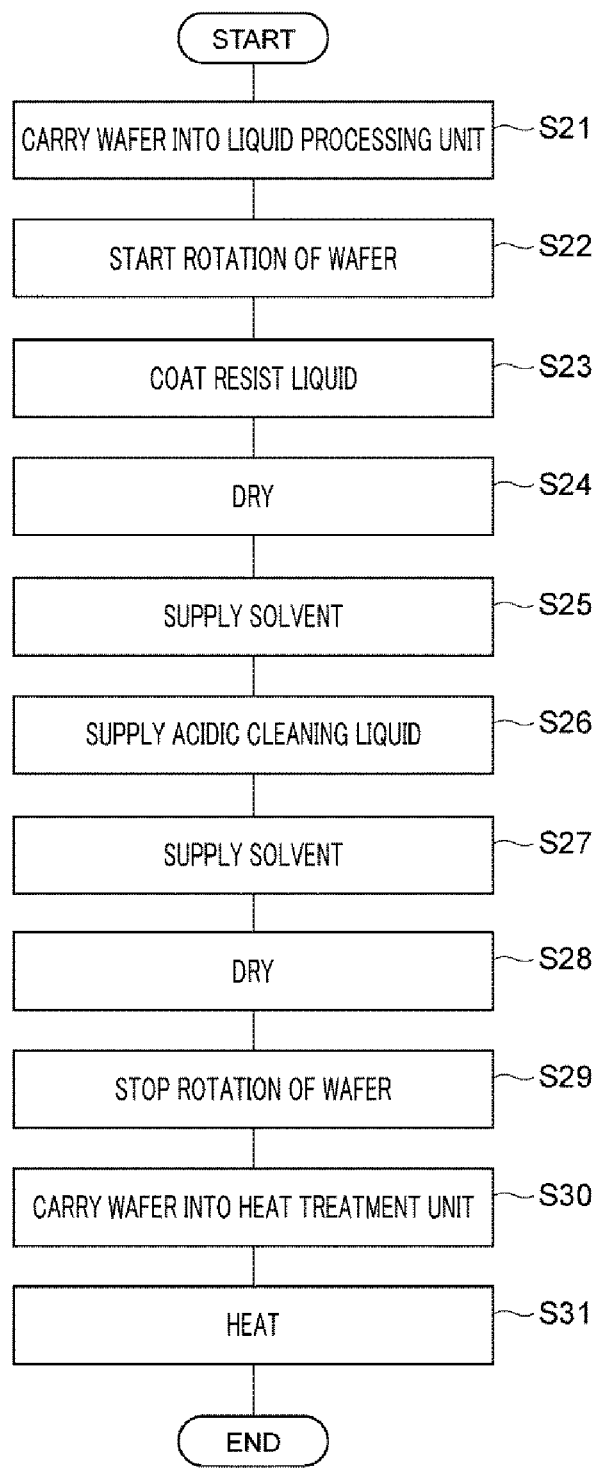
FIG. 14 is a flowchart for describing a sequence of the film formation and cleaning.

Now, the specific content of the processing of the aforementioned process S02 will be described. As depicted in FIG. 14, the controller 900 first performs a process S21. In the process S21, the transfer control unit 911 controls the elevation arm A7 to move the wafer W taken out of the inspecting unit U13 by the transfer arm A3 of the processing module 11 up or down into the processing module 12, control the transfer arm A3 of the processing module 12 to carry the corresponding wafer W into the liquid processing unit U21 and controls the rotating/holding unit 210 to hold the corresponding wafer W.

Then, the controller 900 performs a process S22. In the process S22, the film formation control unit 913 controls the rotating/holding unit 210 to start the rotation of the wafer W.

Figure 15A:
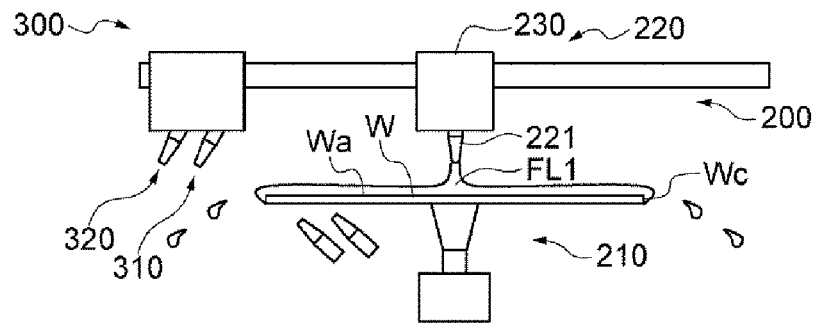
FIG. 15A to FIG. 15D are schematic diagrams illustrating the liquid processing unit which is performing the film formation and cleaning.

Subsequently, the controller 900 performs a process S23. In the process S23, the film formation control unit 913 controls the nozzle position adjusting unit 230 to place the nozzle 221 above a rotation center of the wafer W held by the rotating/holding unit 210, and then controls the liquid supply unit 220 to open the valve 223 to start a discharge of a resist liquid FL1 from the nozzle 221 (see FIG. 15A). Accordingly, a liquid film of the resist liquid FL1 is formed on the front surface Wa of the wafer W being rotated. Thereafter, the film formation control unit 913 controls the liquid supply unit 220 to close the valve 223 to stop the discharge of the resist liquid FL1 from the nozzle 221.

Figure 16A:
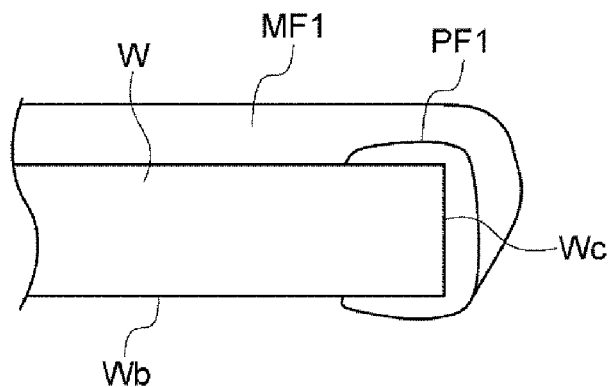
FIG. 16A to FIG. 16C are schematic diagrams illustrating the peripheral portion of the wafer which is being subjected to the film formation and cleaning.

Next, the controller 900 performs a process S24. In the process S24, the film formation control unit 913 continues the rotation of the wafer W by the rotating/holding unit 210 and waits for the drying (the volatilization of the solvent) of the resist liquid FL1. Accordingly, a resist film MF1 is formed on the front surface Wa of the wafer W (see FIG. 16A).

Figure 15B:
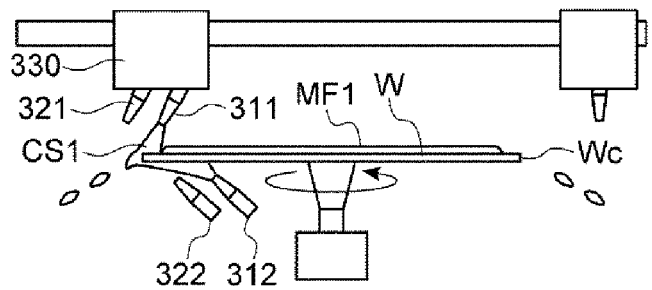
Figure 16B:
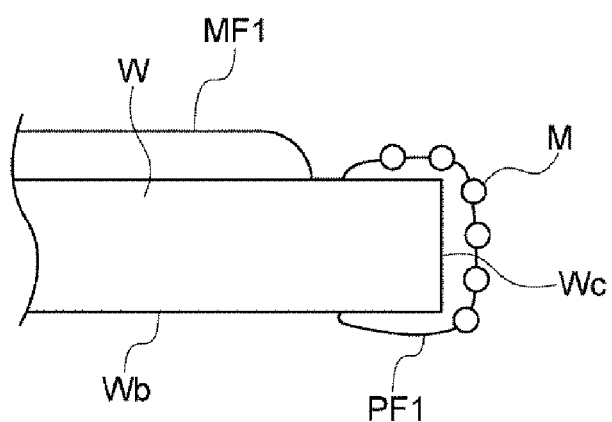

Then, the controller 900 performs a process S25. In the process S25, the periphery removal control unit 914 controls the nozzle position adjusting unit 330 to locate the nozzle 311 above the peripheral portion Wc of the wafer W held by the rotating/holding unit 210, and then controls the liquid supply unit 310 to open the valves 314 and 135 to start a discharge of a first cleaning liquid CS1 from the nozzles 311 and 312 (see FIG. 15B). Accordingly, the first cleaning liquid CS1 is supplied to the peripheral portion Wc of the wafer W being rotated from thereabove and thereunder, so that the resist film MF1 is removed from the corresponding peripheral portion Wc. Thereafter, the periphery removal control unit 914 controls the liquid supply unit 310 to close the valves 314 and 315 to stop the discharge of the first cleaning liquid CS1 from the nozzles 311 and 312. After the discharge of the first cleaning liquid CS1 is stopped, a metal component M may be left at the first protective film PF1 (see FIG. 16B). An intermixing layer, in which a component of the first protective film PF1 and the metal component M are combined, may be formed in a surface layer of the first protective film PF1.

Figure 15C:
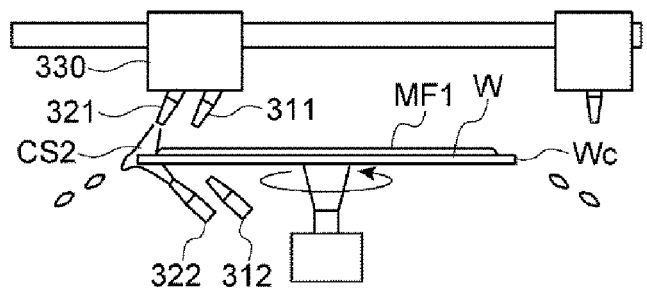
Figure 16C:
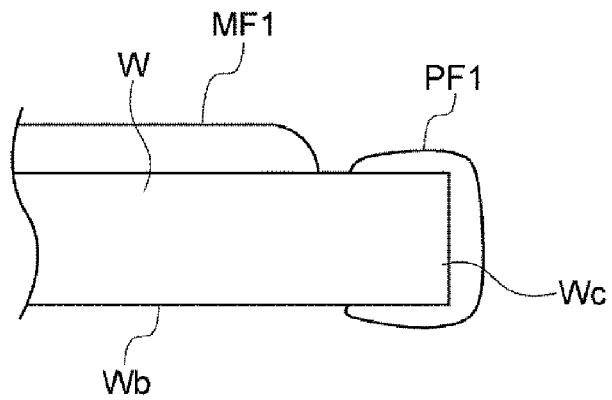

Thereafter, the controller 900 performs a process S26. In the process S26, the cleaning control unit 915 controls the nozzle position adjusting unit 330 to locate the nozzle 321 above the peripheral portion Wc of the wafer W held by the rotating/holding unit 210, and then controls the liquid supply unit 320 to open the valves 324 and 325 to start a discharge of a second cleaning liquid CS2 from the nozzles 321 and 322 (see FIG. 15C). Accordingly, the second cleaning liquid CS2 is supplied to the peripheral portion Wc of the wafer W being rotated from thereabove and thereunder, so that the metal component M adhering to the first protective film PF1 is removed (see FIG. 16C). Then, the cleaning control unit 915 controls the liquid supply unit 320 to close the valves 324 and 325 to stop the discharge of the second cleaning liquid CS2 from the nozzles 321 and 322.

Figure 15D:
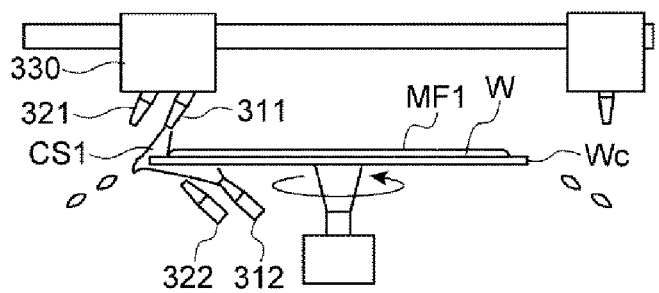

Then, the controller 900 performs a process S27. In the process S27, the cleaning control unit 916 controls the nozzle position adjusting unit 330 to relocate the nozzle 311 above the peripheral portion Wc of the wafer W held by the rotating/holding unit 210, and, then, controls the liquid supply unit 310 to open the valves 314 and 315 to start the discharge of the first cleaning liquid CS1 from the nozzles 311 and 312 (see FIG. 15D). Accordingly, the first cleaning liquid CS1 is supplied to the peripheral portion Wc of the wafer W being rotated from thereabove and thereunder, so that a component of the second cleaning liquid CS2 remaining on the corresponding peripheral portion Wc is removed.

Then, the cleaning control unit 916 controls the liquid supply unit 310 to close the valves 314 and 315 to stop the discharge of the first cleaning liquid CS1 from the nozzles 311 and 312.

Subsequently, the controller 900 performs a process S28. In the process S28, the cleaning control unit 916 continues the rotation of the wafer W by the rotating/holding unit 210 and waits for the scattering and the volatilization of the first cleaning liquid CS1.

Next, the controller 900 performs a process S29. In the process S29, the cleaning control unit 916 controls the rotating/holding unit 210 to stop the rotation of the wafer W.

Thereafter, the controller 900 performs a process S30. In the process S30, the transfer control unit 911 controls the transfer arm A3 to take out the wafer W from the liquid processing unit U21 and carry the taken wafer W into the heat treatment unit U22.

Then, the controller 900 performs a process S31. In the process S31, the heating control unit 917 controls the heat treatment unit U22 to heat the wafer W. Along with the heating of the wafer W, the resist film MF1 formed on the front surface Wa of the corresponding wafer W is also heated. Accordingly, a cross-linking reaction or the like on the resist film MF1 is accelerated, so that strength of the resist film MF1 is improved. Thereafter, the transfer control unit 911 controls the transfer arm A3 to take out the wafer W from the heat treatment unit U22.

(Sequence of Protective Film Removal)

Now, the specific content of the processing of the aforementioned process S03 will be elaborated. As depicted in FIG. 17, the controller 900 first performs a process S41. In the process S41, the transfer control unit 911 controls the elevation arm A7 to move the wafer W taken out of the heat treatment unit U22 by the transfer arm A3 of the processing module 12 up or down into the processing module 13, controls the transfer arm A3 of the processing module 13 to carry the taken wafer W into the liquid processing unit U31 and controls the rotating/holding unit 410 to hold the corresponding wafer W.

Then, the controller 900 performs a process S42. In the process S42, the protective film removal control unit 918 controls the rotating/holding unit 410 to start the rotation of the wafer W.

Figure 18:
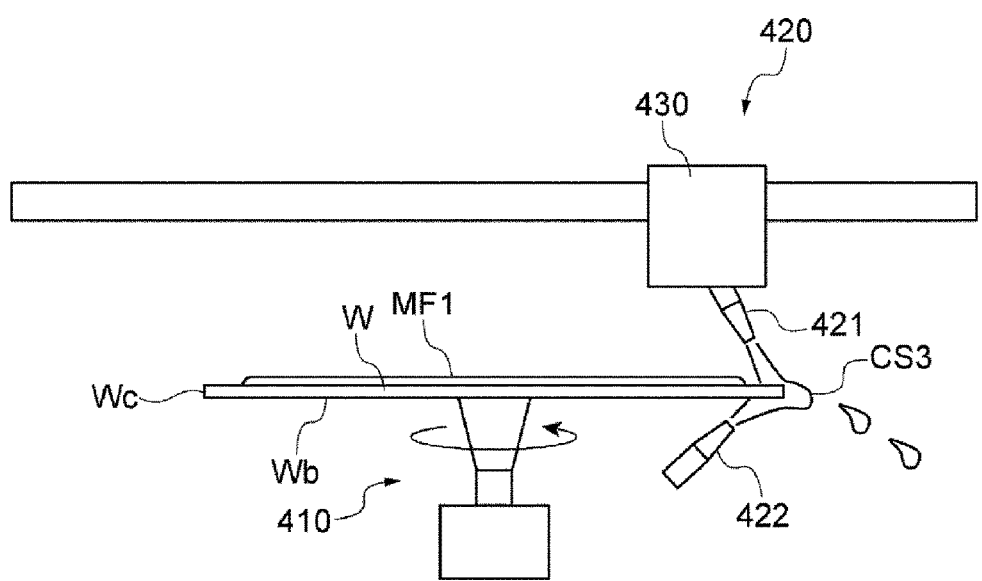
FIG. 18 is a schematic diagram illustrating the liquid processing unit which is removing the protective film.
Figure 19:
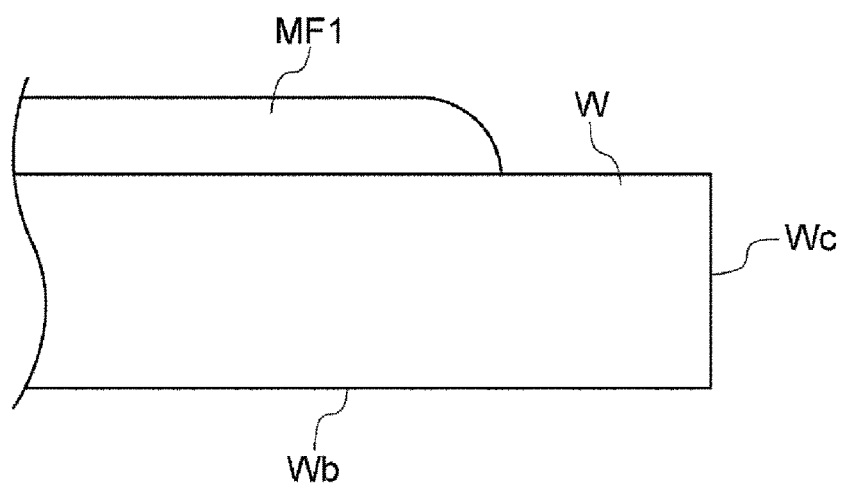
FIG. 19 is a schematic diagram illustrating the peripheral portion of the wafer after the protective film is removed.

Subsequently, the controller 900 performs a process S43. In the process S43, the protective film removal control unit 918 controls the nozzle position adjusting unit 430 to locate the nozzle 421 above the peripheral portion Wc of the wafer W held by the rotating/holding unit 410, and, then, controls the liquid supply unit 420 to open the valves 424 and 425 to start a discharge of a third cleaning liquid CS3 from the nozzles 421 and 422 (see FIG. 18). Accordingly, the third cleaning liquid CS3 is supplied to the peripheral portion Wc of the wafer W being rotated from thereabove and thereunder, so that the first protective film PF1 is removed (see FIG. 19). Then, the protective film removal control unit 918 controls the liquid supply unit 420 to close the valves 424 and 425 to stop the discharge of the third cleaning liquid CS3 from the nozzles 421 and 422.

Thereafter, the controller 900 performs a process S44. In the process S44, the protective film removal control unit 918 continues the rotation of the wafer W by the rotating/holding unit 410 and waits for the scattering and the volatilization of the third cleaning liquid CS3.

Next, the controller 900 performs a process S45. In the process S45, the protective film removal control unit 918 controls the rotating/holding unit 410 to stop the rotation of the wafer W. Then, the transfer control unit 911 controls the transfer arm A3 to take out the wafer W from the liquid processing unit U31.

(Sequence of Protective Film Formation)

Figure 20:
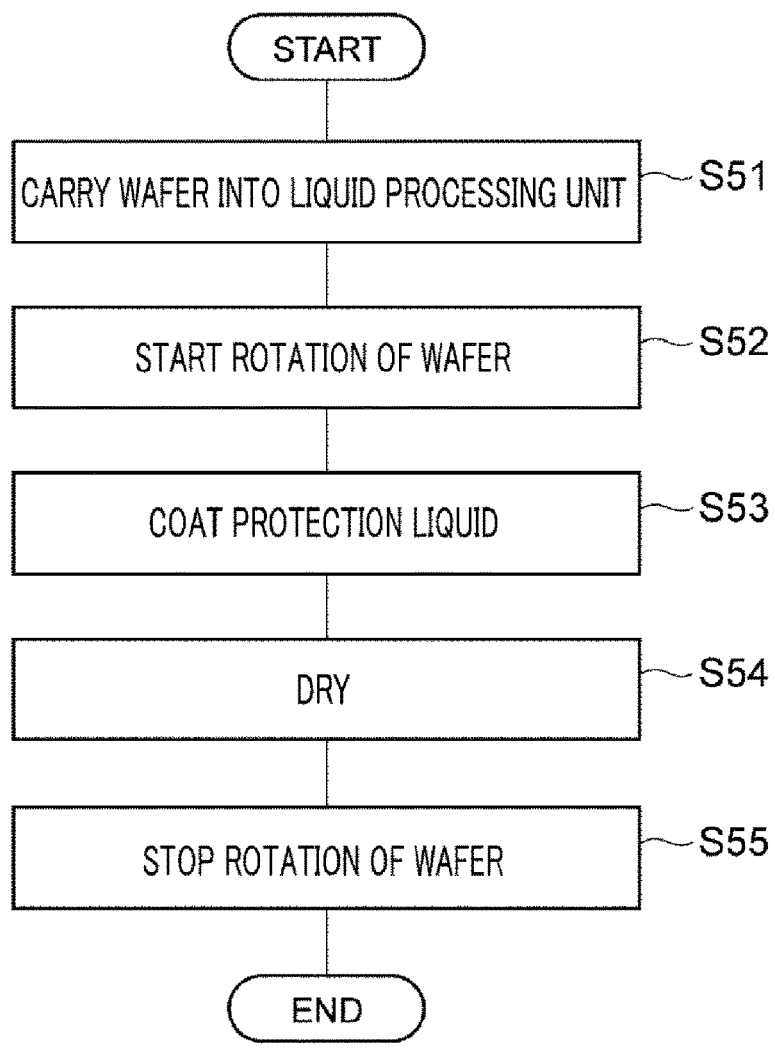
FIG. 20 is a flowchart for describing a sequence of the protective film formation.

Now, the specific content of the processing of the aforementioned process S08 will be described. As illustrated in FIG. 20, the controller 900 first performs a process S51. In the process S51, the carry-in/out control unit 919 controls the delivery arm A8 to carry the wafer W received from the exposure apparatus 3 into the liquid processing unit U53.

Subsequently, the controller 900 performs a process S52. In the process S52, the second protection control unit 920 controls the rotating/holding unit 710 to start the rotation of the wafer W.

Figure 21:
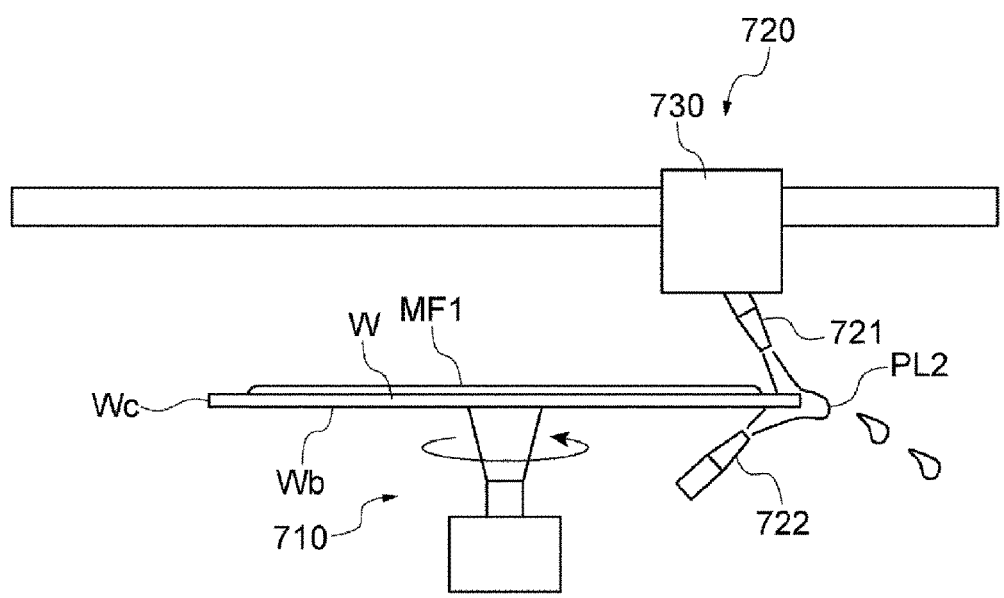
FIG. 21 is a schematic diagram illustrating the liquid processing unit which is forming the protective film.

Then, the controller 900 performs a process S53. In the process S53, the second protection control unit 920 controls the nozzle position adjusting unit 730 to locate the nozzle 721 above the peripheral portion Wc of the wafer W held by the rotating/holding unit 710, and, then, controls the liquid supply unit 720 to open the valves 724 and 725 to start a discharge of a protection liquid PL2 from the nozzles 721 and 722 (see FIG. 21). Accordingly, the protection liquid PL2 is supplied to the peripheral portion Wc of the wafer W being rotated from thereabove and thereunder, so that a liquid film of the protection liquid PL2 is formed on the corresponding peripheral portion Wc. Then, the second protection control unit 920 controls the liquid supply unit 720 to close the valves 724 and 725 to stop the discharge of the protection liquid PL2 from the nozzles 721 and 722.

Figure 22:
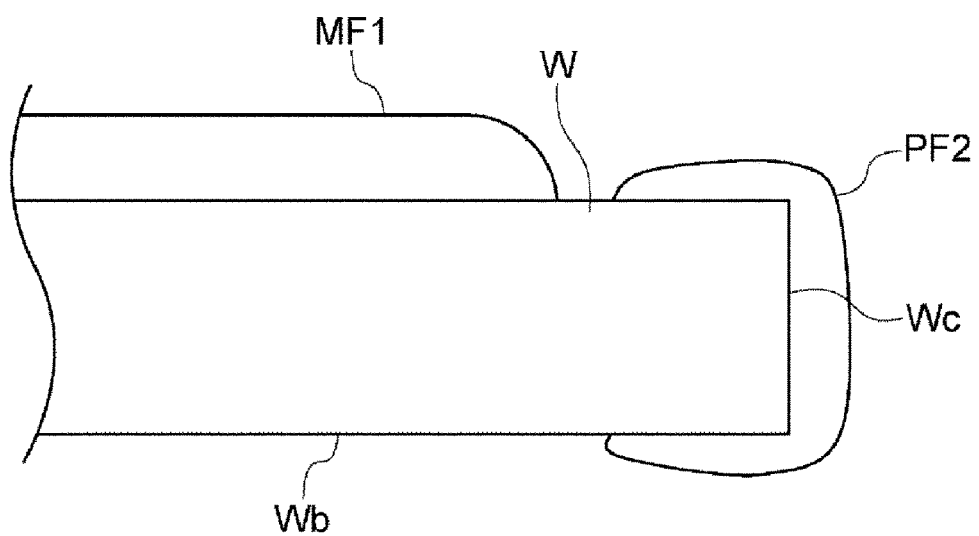
FIG. 22 is a schematic diagram illustrating the peripheral portion of the wafer after the protective film is formed.

Next, the controller 900 performs a process S54. In the process S54, the second protection control unit 920 continues the rotation of the wafer W by the rotating/holding unit 710 and waits for the drying (the volatilization of the solvent) of the protection liquid PL2 on the peripheral portion Wc. Accordingly, a second protective film PF2 is formed on the peripheral portion Wc of the wafer W (see FIG. 22).

Thereafter, the controller 900 performs a process S55. In the process S55, the second protection control unit 920 controls the rotating/holding unit 710 to stop the rotation of the wafer W. Then, the carry-in/out control unit 919 controls the delivery arm A8 to take out the wafer W from the liquid processing unit U53 and transfer the taken wafer W into the processing module 14.

(Sequence of Development and Cleaning)

Figure 23:
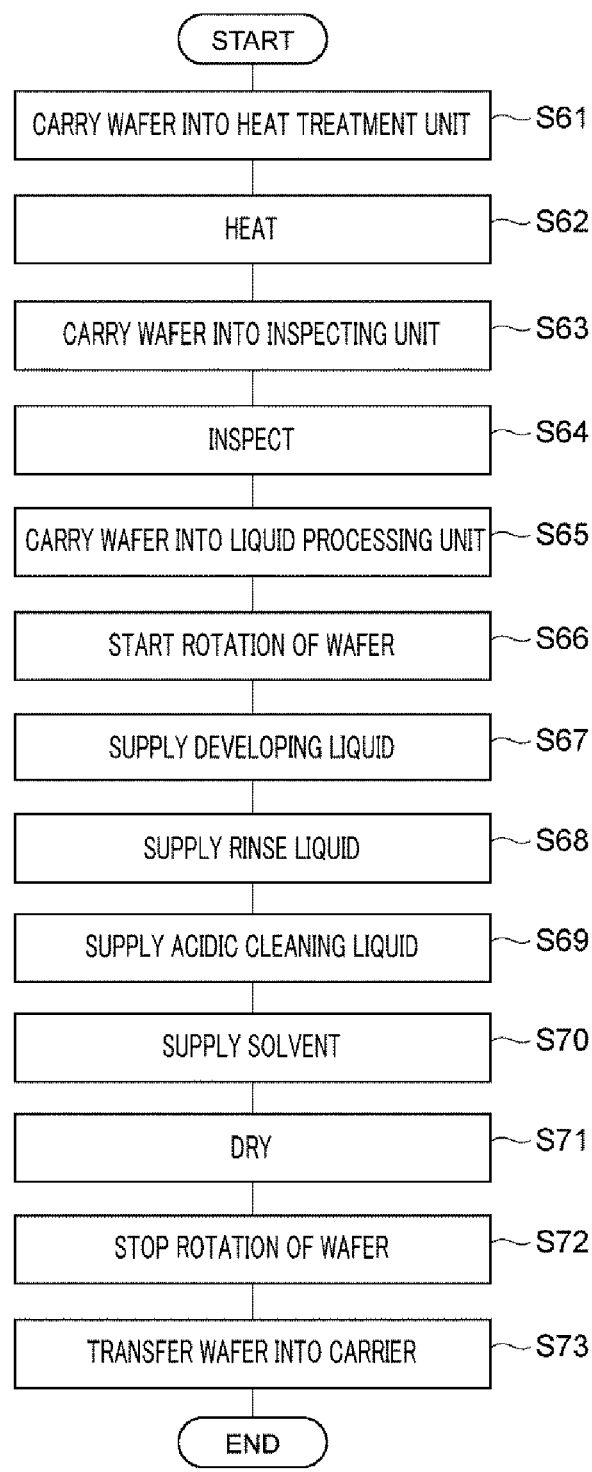
FIG. 23 is a flowchart for describing a sequence of development/cleaning/protective film removal.

Now, the specific content of the processing of the aforementioned process S09 will be discussed. As depicted in FIG. 23, the controller 900 first performs a process S61. In the process S61, the transfer control unit 911 controls the transfer arm A3 of the processing module 14 to carry the wafer W, which is transferred into the processing module 14 by the delivery arm A8, into the heat treatment unit U41.

Then, the controller 900 performs a process S62. In the process S62, the heating control unit 921 controls the heat treatment unit U41 to heat the wafer W. This heating is so-called post exposure bake (PEB). As the wafer W is heated, the resist film MF1 and the second protective film PF2 on the corresponding wafer W are also heated. Accordingly, a reaction (e.g., acid catalytic reaction), in which solubility to a developing liquid at an exposed portion of the resist film MF1 is changed, takes place. A cross-linking reaction or the like is accelerated on the second protective film PF2, so that strength of the second protective film PF2 is improved.

Subsequently, the controller 900 performs a process S63. In the process S63, the transfer control unit 911 controls the transfer arm A3 to take out the wafer W from the heat treatment unit U41 and carry the corresponding wafer W into the inspecting unit U42.

Then, the controller 900 performs a process S64. In the process S64, the development control unit 922 controls the inspecting unit U42 to acquire image information of the second protective film PF2 formed on the peripheral portion Wc of the wafer W, and determines whether a formation state of the second protective film PF2 is normal based on the image information acquired by the inspecting unit U42.

Thereafter, the controller 900 performs a process S65. In the process S65, the transfer control unit 911 controls the transfer arm A3 to take out the wafer W from the inspecting unit U42 and carry the taken wafer W into the liquid processing unit U43, and controls the rotating/holding unit 510 to hold the wafer W.

Next, the controller 900 performs a process S66. In the process S66, the development control unit 922 controls the rotating/holding unit 510 to start the rotation of the wafer W.

Figure 24A:
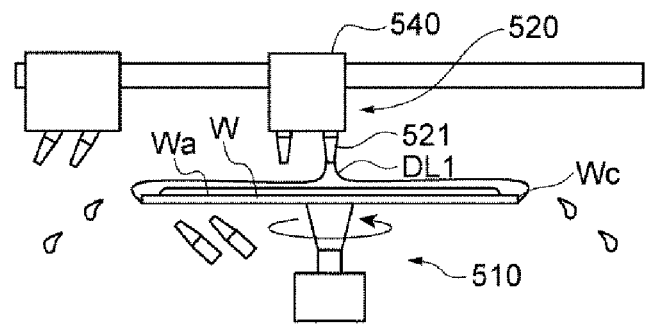
FIG. 24A to FIG. 24D are schematic diagrams illustrating the liquid processing unit which is performing the development/cleaning/protective film removal.

Afterwards, the controller 900 performs a process S67. In the process S67, the development control unit 922 controls the nozzle position adjusting unit 540 to locate the nozzle 521 above the rotation center of the wafer W held by the rotating/holding unit 510, and, then, controls the liquid supply unit 520 to open the valve 523 to start a discharge of a developing liquid DL1 from the nozzle 521 (see FIG. 24A). Accordingly, the developing liquid DL1 is supplied to the resist film MF1, so that one of a portion, where the exposure processing is performed, and the other portion of the resist film MF1 is dissolved by the developing liquid DL1. Thereafter, the development control unit 922 controls the liquid supply unit 520 to close the valve 523 to stop the discharge of the developing liquid DL1 from the nozzle 521.

Figure 24B:
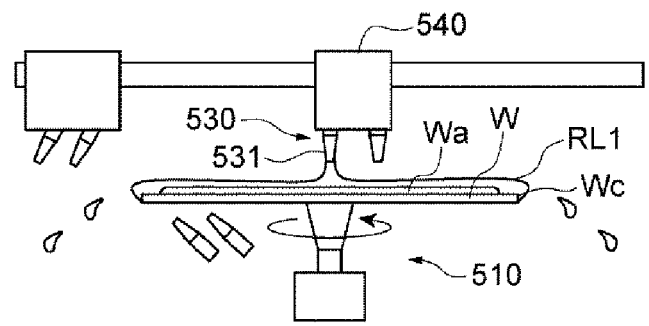

Then, the controller 900 performs a process S68. In the process S68, the development control unit 922 controls the nozzle position adjusting unit 540 to locate the nozzle 531 above the rotation center of the wafer W held by the rotating/holding unit 510, and, then, controls the liquid supply unit 530 to open the valve 533 to start a discharge of a rinse liquid RL1 from the nozzle 531 (see FIG. 24B). Accordingly, the rinse liquid RL1 is supplied to the resist film MF1, so that the developing liquid DL1 and the dissolved component of the resist film MF1 are washed away. Thereafter, the development control unit 922 controls the liquid supply unit 530 to close the valve 533 to stop the discharge of the rinse liquid RL1 from the nozzle 531.

Figure 25A:
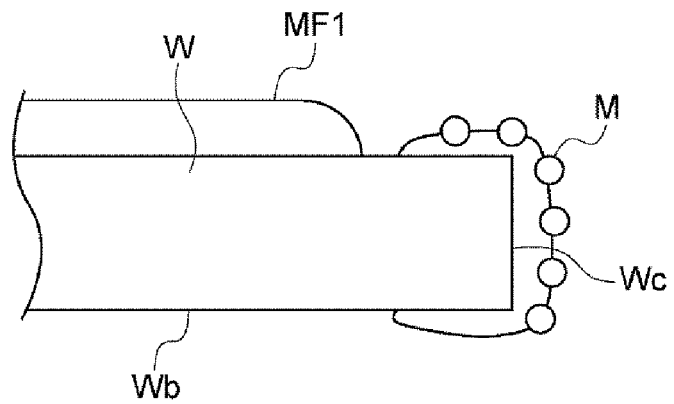
FIG. 25A to FIG. 25C are schematic diagrams illustrating the peripheral portion of the wafer which is being subjected to the development/cleaning/protective film removal.

After the discharge of the rinse liquid RL1 is stopped, a metal component M may remain at the second protective film PF2 (see FIG. 25A). An intermixing layer, in which a component of the second protective film PF2 and the metal component M are combined, may be formed in a surface layer of the second protective film PF2.

Figure 24C:
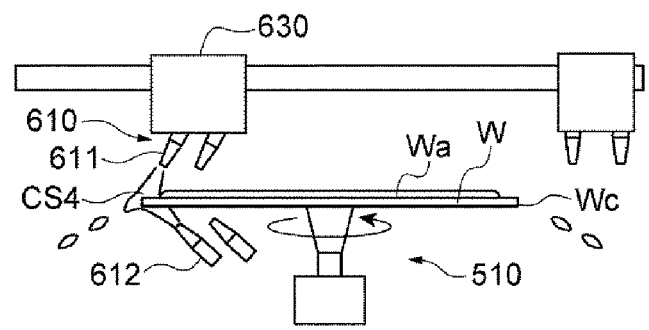
Figure 25B:
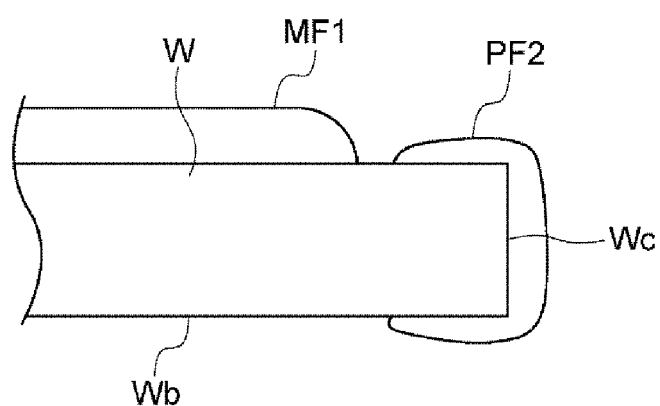

Subsequently, the controller 900 performs a process S69. In the process S69, the cleaning control unit 923 controls the nozzle position adjusting unit 630 to locate the nozzle 611 above the peripheral portion Wc of the wafer W held by the rotating/holding unit 510, and, then, controls the liquid supply unit 610 to open the valves 614 and 615 to start a discharge of a fourth cleaning liquid CS4 from the nozzles 611 and 612 (see FIG. 24C). Accordingly, the fourth cleaning liquid CS4 is supplied to the peripheral portion Wc of the wafer W being rotated from thereabove and thereunder, so that the metal component M adhering to the second protective film PF2 is removed (see FIG. 25B). Then, the cleaning control unit 923 controls the liquid supply unit 610 to close the valves 614 and 615 to stop the discharge of the fourth cleaning liquid CS4 from the nozzles 611 and 612.

Figure 24D:
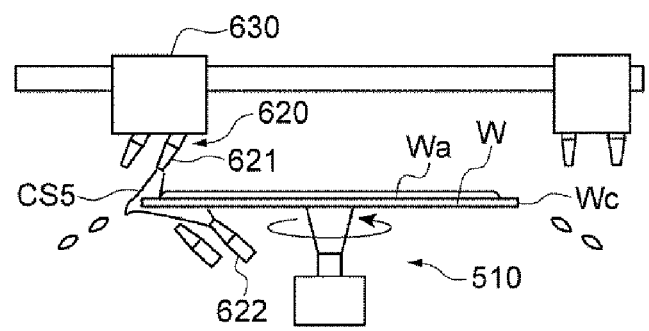
Figure 25C:
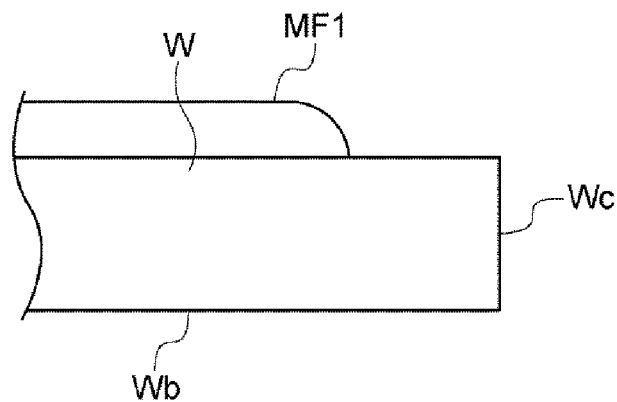

Thereafter, the controller 900 performs a process S70. In the process S70, the protective film removal control unit 924 controls the nozzle position adjusting unit 630 to locate the nozzle 621 above the peripheral portion Wc of the wafer W held by the rotating/holding unit 510, and, then, controls the liquid supply unit 620 to open the valves 624 and 625 to start a discharge of a fifth cleaning liquid CS5 from the nozzles 621 and 622 (see FIG. 24D). Accordingly, the fifth cleaning liquid CS5 is supplied to the peripheral portion Wc of the wafer W being rotated from thereabove and thereunder, so that the second protective film PF2 is removed (see FIG. 25C). Thereafter, the protective film removal control unit 924 controls the liquid supply unit 620 to close the valves 624 and 625 to stop the discharge of the fifth cleaning liquid CS5 from the nozzles 621 and 622.

Next, the controller 900 performs a process S71. In the process S71, the protective film removal control unit 924 continues the rotation of the wafer W by the rotating/holding unit 510 and waits for the scattering and the volatilization of the fifth cleaning liquid CS5.

Afterwards, the controller 900 performs a process S72. In the process S72, the protective film removal control unit 924 controls the rotating/holding unit 510 to stop the rotation of the wafer W.

Then, the controller 900 performs a process S73. In the process S73, the transfer control unit 911 controls the transfer arm A3 to take out the wafer W from the liquid processing unit U43, and controls the delivery arm A1 to carry the taken wafer W into the carrier C.

Effects of Present Exemplary Embodiment

As stated above, the coating and developing apparatus 2 is equipped with the first protection processing unit U01 configured to form the first protective film PF1 on the peripheral portion Wc of the wafer W; the film forming unit U02 configured to form the metal-containing resist film MF1 on the front surface Wa of the wafer W; the first cleaning processing unit U3 configured to perform the cleaning processing of the peripheral portion Wc of the wafer W on which the resist film MF1 is formed; and the control unit U08. The control unit U08 is configured to control the first protection processing unit U01 to form the first protective film PF1 on the peripheral portion Wc of the wafer W; control the film forming unit U02 to form the resist film MF1 on the front surface Wa of the wafer W on which the first protective film PF1 is formed; control the first cleaning processing unit U03 to supply the first cleaning liquid CS1 for removing the resist film MF1 to the peripheral portion Wc of the wafer W on which the resist film MF1 is formed; control the first cleaning processing unit U03 to supply the second cleaning liquid CS2 for removing the metal component to the peripheral portion Wc of the wafer W after the first cleaning liquid CS1 is supplied to the corresponding peripheral portion Wc; and control the first cleaning processing unit U03 to supply the third cleaning liquid CS3 for removing the first protective film PF1 to the peripheral portion Wc of the wafer W after the second cleaning liquid CS2 is supplied to the corresponding peripheral portion Wc.

According to the coating and developing apparatus 2, by forming the resist film MF1 on the front surface Wa of the wafer W in the state that the first protective film PF1 is formed on the peripheral portion Wc of the wafer W, the adhesion of the metal component to the peripheral portion Wc of the wafer W is suppressed. After the peripheral portion of the resist film MF1 is removed, by removing the first protective film PF1, the metal component remaining at the first protective film PF1 is also removed. Thus, the metal component can be sufficiently suppressed from being left at the peripheral portion Wc of the wafer W.

The present inventors, however, have found out that the metal component can be still left at the peripheral portion Wc of the wafer W even after the first protective film PF1 is removed. As a reason for this phenomenon, it may be deemed that a part of the metal component remaining at a surface of the first protective film PF1 may adhere to the peripheral portion of the substrate while removing the first protective film PF1. As a countermeasure to the metal component remaining even after the first protective film PF1 is removed, it may be considered to additionally clean the peripheral portion Wc of the wafer W after the first protective film PF1 is removed. Since, however, the wafer W is exposed to a chemical liquid having high cleaning power to the metal component, the wafer W may be corroded.

Meanwhile, according to the coating and developing apparatus 2, the supply of the second cleaning liquid CS2 for removing the metal component is performed prior to the supply of the third cleaning liquid CS3 for removing the first protective film PF1. By supplying the second cleaning liquid CS2, most of the metal component remaining at the first protective film PF1 is removed. At this time, since the peripheral portion Wc of the wafer W is protected by the first protective film PF1, the corrosion of the wafer W by the second cleaning liquid CS2 is suppressed. By supplying the second cleaning liquid CS2 before the supply of the third cleaning liquid CS3, the first protective film PF1 is removed in the state that the metal component remaining at the first protective film PF1 is greatly reduced. Thus, the metal component left at the peripheral portion Wc of the wafer W after the first protective film PF1 is removed is also greatly reduced. Therefore, metal contamination that might be caused by the supplying of the metal-containing resist film MF1 can be suppressed.

The second cleaning liquid CS2 may have strong acidity as compared to the first cleaning liquid CS1 and the third cleaning liquid CS3. In such a case, larger amount of the metal component can be removed before the first protective film PF1 is removed.

The controller 900 may be configured to additionally control the first cleaning processing unit U03 to supply the first cleaning liquid CS1 to the peripheral portion Wc of the wafer W before the third cleaning liquid CS3 is supplied to the corresponding peripheral portion Wc after the second cleaning liquid CS2 is supplied thereto. In this case, by removing a remaining component of the second cleaning liquid CS2 through the supply of the first cleaning liquid CS1, a material remaining at the peripheral portion Wc of the wafer W after the removal of the first protective film PF1 can be additionally reduced.

The coating and developing apparatus 2 may be additionally equipped with the heat treatment unit U04 configured to heat the resist film MF1. The controller 900 may be configured to additionally control the heat treatment unit U04 to heat the resist film MF1 of the wafer W before the third cleaning liquid CS3 is supplied to the peripheral portion Wc of the wafer W after the first cleaning liquid CS1 is supplied to the corresponding peripheral portion Wc of the wafer W on which the resist film MF1 is formed. In this case, by heating the resist film MF1, the strength of the resist film MF1 is improved. Prior to improving the strength of the resist film MF1 through the heating, by supplying the first cleaning liquid CS1 to the peripheral portion Wc of the wafer W, the removal of the corresponding peripheral portion can be easily performed. By enhancing the strength of the resist film MF1 through the heating before the supply of the third cleaning liquid CS3, elution of the metal component from the resist film MF1 during the supply of the third cleaning liquid CS3 can be suppressed more securely. Therefore, the metal component remaining at the peripheral portion Wc of the wafer W can be reduced more securely.

The coating and developing apparatus 2 may be further equipped with the second protection processing unit U07 configured to form the second protective film PF2 on the peripheral portion Wc of the wafer W; the developing processing unit U05 configured to perform the developing processing of the resist film MF1; and the second cleaning processing unit U06 configured to perform the cleaning processing of the peripheral portion Wc of the wafer W on which the developing processing of the resist film MF1 is performed. The controller 900 may be configured to additionally control the second protection processing unit U07 to form the second protective film PF2 on the peripheral portion Wc of the wafer W after the third cleaning liquid CS3 is supplied to the corresponding peripheral portion Wc; control the developing processing unit U05 to perform the developing processing on the resist film MF1 of the wafer W on which the second protective film PF2 is formed; control the second cleaning processing unit U06 to supply the fourth cleaning liquid CS4 for removing the metal component to the peripheral portion Wc of the wafer W on which the developing processing of the resist film MF1 is performed; and control the second cleaning processing unit U06 to supply the fifth cleaning liquid CS5 for removing the second protective film PF2 to the peripheral portion Wc of the wafer W after the fourth cleaning liquid CS4 is supplied to the corresponding peripheral portion Wc. In this case, the same sequence including the formation of the first protective film PF1, the removal of the metal component by the second cleaning liquid CS2 and the removal of the first protective film PF1 by the third cleaning liquid CS3, which are performed in the stage of forming the resist film MF1, is also performed in the developing stage of the resist film MF1, so that the metal component remaining at the peripheral portion Wc of the wafer W can be more securely reduced.

In the above, the exemplary embodiment has been described. However, it should be noted that the exemplary embodiment is not limiting and various changes and modification may be made without departing from the spirit and scope of the present disclosure.

Figure 26A:
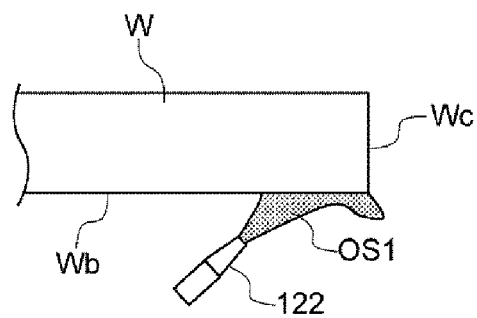
FIG. 26A to FIG. 26D are schematic diagrams showing a modification example of the sequence of the protective film formation.
Figure 26B:
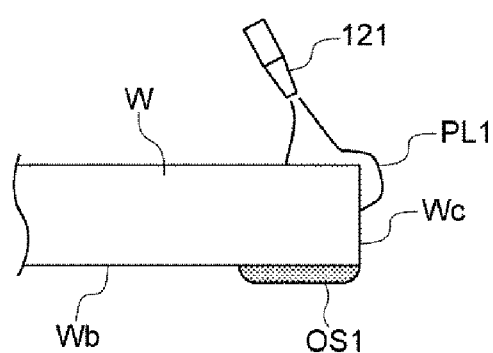
Figure 26C:
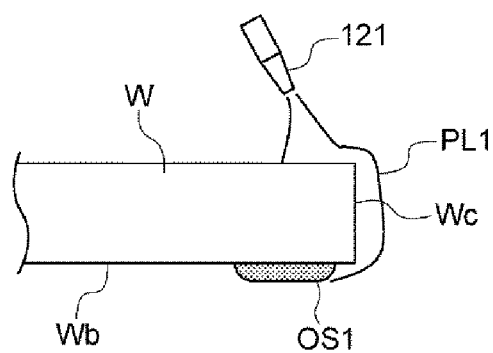
Figure 26D:
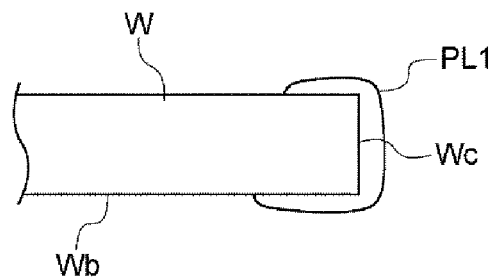

The configuration of the protection processing unit 100 is not limited to a configuration in which the protection liquid PL1 is supplied to the peripheral portion Wc of the wafer W from thereabove and thereunder. By way of example, the protection processing unit 100 may be configured to supply the protection liquid PL1 from the nozzle 121 and to supply an organic solvent OS1, which is different from the protection liquid PL1, from the nozzle 122. As depicted in FIG. 26A and FIG. 26B, the control unit U08 may control the liquid supply unit 120 to supply the protection liquid PL1 from the nozzle 121 after controlling the liquid supply unit 120 to supply the organic solvent OS1 from the nozzle 122. In this case, the organic solvent OS1 coated at a lower side of the peripheral portion Wc serves as priming, and the protection liquid PL1 supplied from above is induced to the lower side of the peripheral portion Wc as well (see FIG. 26C and FIG. 26D). Accordingly, the upper and lower sides of the peripheral portion Wc can be protected by the first protective film PF1 without supplying the protection liquid PL1 from both of the nozzles 121 and 122. The configuration of the protection processing unit 700 and the control sequence thereof can be likewise modified.

The control unit U08 may be configured to control the heat treatment unit U04 to heat the resist film MF1 of the wafer W before the second cleaning liquid CS2 is supplied to the peripheral portion Wc of the wafer W after the first cleaning liquid CS1 is supplied to the corresponding peripheral portion Wc of the wafer W on which the resist film MF1 is formed. In this case, the liquid supply unit 320 configured to supply the second cleaning liquid CS2 may be provided in the cleaning processing unit 400 of the liquid processing unit U31. The cleaning processing unit 400 may be configured to move the nozzle 321 by the nozzle position adjusting unit 430 or may have a nozzle position adjusting unit for the nozzle 321 provided separately from the nozzle position adjusting unit 430.

According to the configuration in which the resist film MF1 of the wafer W is heated before the second cleaning liquid CS2 is supplied to the peripheral portion Wc of the wafer W after the first cleaning liquid CS1 is supplied to the corresponding peripheral portion Wc of the wafer W on which the resist film MF1 is formed, the strength of the resist film MF1 is improved through the heating before the supply of the second cleaning liquid CS2. Thus, elution of the metal component from the resist film MF1 during the supply of the second cleaning liquid CS2 can be more securely suppressed. Therefore, the metal component remaining at the peripheral portion Wc of the wafer W can be reduced more securely.

The control unit U08 may be configured to control the heat treatment unit U04 to heat the resist film MF1 of the wafer W after the third cleaning liquid CS3 is supplied to the peripheral portion Wc of the wafer W. In this case, the liquid supply unit 420 configured to supply the third cleaning liquid CS3 may be provided in the cleaning processing unit 300 of the liquid processing unit U21. On the assumption of this, the coating and developing apparatus 2 may not have the liquid processing unit U31. The cleaning processing unit 300 may be configured to move the nozzle 421 by the nozzle position adjusting unit 330 or may have a nozzle position adjusting unit for the nozzle 421 provided separately from the nozzle position adjusting unit 330.

According to the configuration in which the resist film MF1 of the wafer W is heated after the third cleaning liquid CS3 is supplied to the peripheral portion Wc of the corresponding wafer W, the processes of removing the unnecessary portion of the resist film MF1 are performed altogether before the process of heating the resist film MF1. Therefore, efficiency of the substrate processing can be improved.

The control unit U08 may be configured to control the developing processing unit U05 to perform the developing processing of the peripheral portion Wc of the wafer W before the third cleaning liquid CS3 is supplied to the peripheral portion Wc of the wafer W after the second cleaning liquid CS2 is supplied thereto and control the second cleaning processing unit U06 to supply the fourth cleaning liquid CS4 for removing the metal component to the peripheral portion Wc of the wafer W before the third cleaning liquid CS3 is supplied to the peripheral portion Wc of the wafer W on which the developing processing of the peripheral portion Wc of the wafer W is performed. In this case, the liquid supply unit 420 instead of the liquid supply unit 620 may be provided in the cleaning processing unit 600. On the assumption of this, the coating and developing apparatus 2 may not have the liquid processing unit U31 and the liquid processing unit U53.

According to the configuration in which the developing processing of the peripheral portion Wc of the wafer W is performed before the third cleaning liquid CS3 is supplied to the peripheral portion Wc of the wafer W after the second cleaning liquid CS2 is supplied thereto and in which the fourth cleaning liquid CS4 is supplied to the peripheral portion Wc of the wafer W before the third cleaning liquid CS3 is supplied to the corresponding peripheral portion Wc of the wafer W on which the developing processing of the peripheral portion Wc is performed, the first protective film PF1 is commonly shared in the stage of forming the resist film MF1 and in the stage of the developing the resist film MF1. Thus, the efficiency of the substrate processing can be improved.

In case that the peripheral portion of the resist film MF1 can be removed by the second cleaning liquid CS2, the control unit U08 may be configured not to control the first cleaning processing unit U03 to supply the first cleaning liquid CS1 before the second cleaning liquid CS2 is supplied to the peripheral portion Wc of the wafer W on which the resist film MF1 is formed. In this case, the cleaning processing unit 300 may not have the liquid supply unit 310 configured to supply the first cleaning liquid CS1.

According to this configuration, the efficiency of the substrate processing can be further improved. Further, the configuration in which the first cleaning liquid CS1 is not supplied before the second cleaning liquid CS2 is supplied to the peripheral portion Wc of the wafer W on which the resist film MF1 is formed is generalized as recited in remarks to be provided later.

The formation of the first protective film PF1, the removal of the metal component by the second cleaning liquid CS2 and the removal of the first protective film PF1 by the third cleaning liquid CS3, which are performed in the stage of forming the resist film MF1, may be applied to formation of another film of the resist film MF1. Such another film of the resist film MF1 may be, by way of non-limiting example, a hard mask containing a metal (a metal hard mask), or the like. The substrate as the processing target may not be limited to the semiconductor wafer but may be a glass substrate, a mask substrate, a FPD (Flat Panel Display), or the like.

(Remark 1)

A substrate processing apparatus, comprising:

a first protection processing unit configured to form a first protective film on a peripheral portion of a substrate;

a film forming unit configured to form a film containing a metal on a front surface of the substrate;

a first cleaning processing unit configured to perform a cleaning processing of the peripheral portion of the substrate on which the film is formed; and a control unit, wherein the control unit is configured to:

control the first protection processing unit to form the first protective film on the peripheral portion of the substrate, control the film forming unit to form the film on the front surface of the substrate on which the first protective film is formed, control the first cleaning processing unit to supply a first chemical liquid for removing a metal component to the peripheral portion of the substrate on which the film is formed, control the first cleaning processing unit to supply a second chemical liquid for removing the first protective film to the peripheral portion of the substrate after the first chemical liquid is supplied to the peripheral portion of the substrate.

(Remark 2)

The substrate processing apparatus of Remark 1, wherein the second chemical liquid has strong acidity as compared to the first chemical liquid.

(Remark 3)

The substrate processing apparatus of Remark 1 or 2, wherein the control unit is further configured to control the first cleaning processing unit to supply the third chemical liquid for removing a remaining component of the first chemical liquid to the peripheral portion of the substrate before the second chemical liquid is supplied to the peripheral portion of the substrate and after the first chemical liquid is supplied to the peripheral portion thereof.

(Remark 4)

The substrate processing apparatus of any one of Remarks 1 to 3, further comprising:

a heat treatment unit configured to heat the film, wherein the control unit is further configured to control the heat treatment unit to heat the film of the substrate before the second chemical liquid is supplied to the peripheral portion of the substrate and after the first chemical liquid is supplied to the peripheral portion of the substrate on which the film is formed.

(Remark 5)

The substrate processing apparatus of any one of Remarks 1 to 3, further comprising:

a heat treatment unit configured to heat the film, wherein the control unit is further configured to control the heat treatment unit to heat the film of the substrate after the second chemical liquid is supplied to the peripheral portion of the substrate.

(Remark 6)

The substrate processing apparatus of any one of Remarks 1 to 5, further comprising:

a second protection processing unit configured to form a second protective film on the peripheral portion of the substrate;

a developing processing unit configured to perform a developing processing of the film; and a second cleaning processing unit configured to perform a cleaning processing of the peripheral portion of the substrate on which the developing processing of the film is performed, wherein the control unit is further configured to:

control the second protection processing unit to form the second protective film on the peripheral portion of the substrate after the second chemical liquid is supplied to the peripheral portion of the substrate, control the developing processing unit to perform the developing processing of the film of the substrate on which the second protective film is formed, control the second cleaning processing unit to supply the third chemical liquid for removing the metal component to the peripheral portion of the substrate on which the developing processing of the film is performed, and control the second cleaning processing unit to supply a fourth chemical liquid for removing the second protective film to the peripheral portion of the substrate after the third chemical liquid is supplied to the peripheral portion of the substrate.

(Remark 7)

The substrate processing apparatus of any one of Remarks 1 to 5, further comprising:

a developing processing unit configured to perform a developing processing of the film; and a second cleaning processing unit configured to perform a cleaning processing of the peripheral portion of the substrate on which the developing processing of the film is performed, wherein the control unit is further configured to:
control the developing processing unit to perform the developing processing of the film of the substrate before the second chemical liquid is supplied to the peripheral portion of the substrate and after the first chemical liquid is supplied to the peripheral portion thereof, and
control the second cleaning processing unit to supply the third chemical liquid for removing the metal component to the peripheral portion of the substrate before the second chemical liquid is supplied to the peripheral portion of the substrate on which the developing processing of the film is performed.

Experimental Examples

Now, experimental examples will be explained. However, it should be noted that the experimental examples are not limiting.

Preparation of Sample

Experimental Example 1

A sample of an experimental example 1 is prepared by forming the resist film MF1 on the wafer W through the following sequence. First, by performing the above-stated processes S11 to S19, the first protective film PF1 is formed on the peripheral portion Wc of the wafer W. In the process S17, the first protective film PF1 is heated at a set temperature of 350° C. Then, by performing the above-described processes S21 to S31, the formation of the resist film MF1 on the front surface Wa of the wafer W, the removal of the peripheral portion of the resist film MF1, the cleaning of the peripheral portion Wc and the heating of the resist film MF1 are performed. Then, by performing the above-stated processes S41 to S45, the first protective film PF1 is removed.

Comparative Example 1

A sample of a comparative example 1 is prepared by forming the resist film MF1 on the wafer W through the following sequence. First, by performing the above-stated processes S11 to S19, the first protective film PF1 is formed on the peripheral portion Wc of the wafer W. In the process S17, the first protective film PF1 is heated at a set temperature of 250° C. Then, by performing the above-described processes S21 to S31 without performing the processes S26 and S27, the formation of the resist film MF1 on the front surface Wa of the wafer W and the removal of the peripheral portion of the resist film MF1 are performed. Then, by performing the above-stated processes S41 to S45, the first protective film PF1 is removed.

Comparative Example 2

A sample of a comparative example 2 is prepared by forming the resist film MF1 on the wafer W through the same sequence as the comparative example 1 except that the set temperature in the process S17 is changed to 350° C. from 250° C.

Comparative Example 3

A sample of a comparative example 3 is prepared by performing, after forming the resist film MF1 on the wafer W through the same sequence as the comparative example 2, the processes S26 and S27 on the corresponding wafer W.

That is, the sample of the comparative example 3 is prepared by cleaning the peripheral portion Wc of the wafer W with the second cleaning liquid CS2 and the first cleaning liquid CS1 after removing the first protective film PF1.

<Investigation of Residual Amount of Metal Component>

An outermost surface of the peripheral portion Wc of the wafer W is brought into contact with an acidic liquid by using a horizontal type substrate inspecting device, and the total amount of a liquid obtained by this liquid contact is collected and used as a test sample liquid. This test sample liquid is measured by inductively coupled plasma mass spectrometry (ICP-MS) method. A mass obtained by this measurement is converted to the number of atoms, and by dividing this number of atoms by a liquid contact area, the number of atoms per unit area is obtained.

<Investigation Result of Residual Amount of Metal Component>

Figure 27:
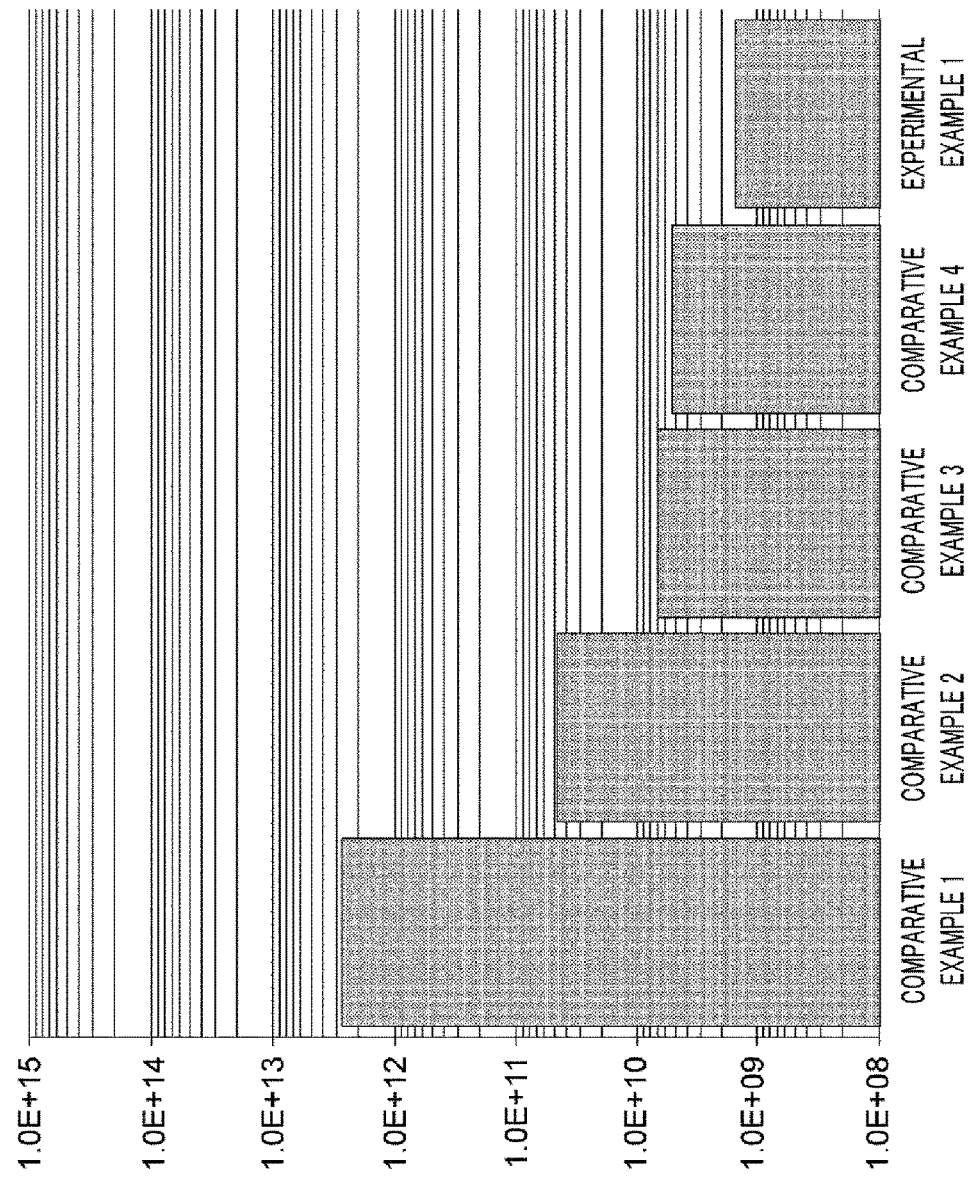
FIG. 27 is a graph showing a comparison result of a residual amount of a metal component.

As shown in FIG. 27, in the comparative example 1, the number of metal atoms left per 1 square centimeter is found to be $2.7 \times 10^{12}$. In comparison, in the comparative example 2, the number of metal atoms remaining per 1 square centimeter is found to be $4.7 \times 10^{10}$, which is reduced to $\frac{1}{57}$ of that of the comparative example 1. From this result, it is found out that the metal component remaining at the peripheral portion Wc can be greatly reduced by forming the first protective film PF1 prior to the formation of the resist film MF1 and then removing the first protective film PF1 later.

In the comparative example 3, the number of metal atoms left per 1 square centimeter is found to be $7.1 \times 10^9$, which is reduced to $\frac{1}{7}$ of that of the comparative example 2. From this result, it is found out that the metal component remaining at the peripheral portion Wc can be greatly reduced by enhancing the strength of the first protective film PF1 by increasing the heating temperature of the first protective film PF1.

In a comparative example 4, the number of metal atoms left per 1 square centimeter is found to be $5.1 \times 10^9$, and the metal component is not greatly reduced as compared to the comparative example 3. In the experimental example 1, the number of metal atoms left per 1 square centimeter is found to be $1.5 \times 10^9$, which is reduced to $\frac{1}{5}$ of that of the comparative example 3. From this result, it is found out that the metal component can be greatly reduced in the case of performing the cleaning processing with the second cleaning liquid CS2 before removing the first protective film PF1, as compared to the case of performing the cleaning processing with the second cleaning liquid CS2 after the first protective film PF1 is removed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A substrate processing apparatus, comprising:
a first protection processing unit configured to form a first protective film on a peripheral portion of a substrate;
a film forming unit configured to form a film containing a metal on a front surface of the substrate;

a first cleaning processing unit configured to perform a cleaning processing of the peripheral portion of the substrate on which the film is formed; and a control unit, wherein the control unit is configured to:

control the first protection processing unit to form the first protective film on the peripheral portion of the substrate, control the film forming unit to form the film on the front surface of the substrate on which the first protective film is formed, control the first cleaning processing unit to supply a first chemical liquid for removing the film to the peripheral portion of the substrate on which the film is formed, control the first cleaning processing unit to supply a second chemical liquid for removing a metal component to the peripheral portion of the substrate after the first chemical liquid is supplied to the peripheral portion of the substrate, and control the first cleaning processing unit to supply a third chemical liquid for removing the first protective film to the peripheral portion of the substrate after the second chemical liquid is supplied to the peripheral portion of the substrate.

2. The substrate processing apparatus of claim 1, wherein the second chemical liquid has strong acidity as compared to the first chemical liquid and the third chemical liquid.

3. The substrate processing apparatus of claim 2, wherein the control unit is further configured to control the first cleaning processing unit to supply the first chemical liquid to the peripheral portion of the substrate before the third chemical liquid is supplied to the peripheral portion of the substrate and after the second chemical liquid is supplied to the peripheral portion thereof.

4. The substrate processing apparatus of claim 1, further comprising:

a heat treatment unit configured to heat the film, wherein the control unit is further configured to control the heat treatment unit to heat the film of the substrate before the third chemical liquid is supplied to the peripheral portion of the substrate and after the first chemical liquid is supplied to the peripheral portion of the substrate on which the film is formed.

5. The substrate processing apparatus of claim 4, wherein the control unit is configured to control the heat treatment unit to heat the film of the substrate before the second chemical liquid is supplied to the peripheral portion of the substrate and after the first chemical liquid is supplied to the peripheral portion of the substrate on which the film is formed.

6. The substrate processing apparatus of claim 1, further comprising:

a heat treatment unit configured to heat the film, wherein the control unit is further configured to control the heat treatment unit to heat the film of the substrate after the third chemical liquid is supplied to the peripheral portion of the substrate.

7. The substrate processing apparatus of claim 1, further comprising:

a second protection processing unit configured to form a second protective film on the peripheral portion of the substrate;

a developing processing unit configured to perform a developing processing of the film; and a second cleaning processing unit configured to perform a cleaning processing of the peripheral portion of the substrate on which the developing processing of the film is performed, wherein the control unit is further configured to:

control the second protection processing unit to form the second protective film on the peripheral portion of the substrate after the third chemical liquid is supplied to the peripheral portion of the substrate, control the developing processing unit to perform the developing processing of the film of the substrate on which the second protective film is formed, control the second cleaning processing unit to supply a fourth chemical liquid for removing the metal component to the peripheral portion of the substrate on which the developing processing of the film is performed, and control the second cleaning processing unit to supply a fifth chemical liquid for removing the second protective film to the peripheral portion of the substrate after the fourth chemical liquid is supplied to the peripheral portion of the substrate.

8. The substrate processing apparatus of claim 1, further comprising:

a developing processing unit configured to perform a developing processing of the film; and a second cleaning processing unit configured to perform a cleaning processing of the peripheral portion of the substrate on which the developing processing of the film is performed, wherein the control unit is further configured to:

control the developing processing unit to perform the developing processing of the film of the substrate before the third chemical liquid is supplied to the peripheral portion of the substrate and after the second chemical liquid is supplied to the peripheral portion thereof, and control the second cleaning processing unit to supply a fourth chemical liquid for removing the metal component to the peripheral portion of the substrate before the third chemical liquid is supplied to the peripheral portion of the substrate on which the developing processing of the film is performed.

9. A substrate processing method, comprising:

forming a first protective film on a peripheral portion of a substrate;

forming a film containing a metal on a front surface of the substrate on which the first protective film is formed;

supplying a first chemical liquid for removing the film to the peripheral portion of the substrate on which the film is formed;

supplying a second chemical liquid for removing a metal component to the peripheral portion of the substrate after the supplying of the first chemical liquid to the peripheral portion of the substrate; and supplying a third chemical liquid for removing the first protective film to the peripheral portion of the substrate after the supplying of the second chemical liquid to the peripheral portion of the substrate.

10. The substrate processing method of claim 9, wherein the second chemical liquid has strong acidity as compared to the first chemical liquid and the third chemical liquid.

11. The substrate processing method of claim 10, further comprising:

supplying the first chemical liquid to the peripheral portion of the substrate before the supplying of the third chemical liquid to the peripheral portion of the substrate and after the supplying of the second chemical liquid to the peripheral portion of the substrate.

12. The substrate processing method of claim 9, further comprising:

heating the film of the substrate before the supplying of the third chemical liquid to the peripheral portion of the substrate and after the supplying of the first chemical liquid to the peripheral portion of the substrate on which the film is formed.

13. The substrate processing method of claim 12, wherein the heating of the film of the substrate is performed before the supplying of the second chemical liquid to the peripheral portion of the substrate and after the supplying of the first chemical liquid to the peripheral portion of the substrate on which the film is formed.

14. The substrate processing method of claim 9, further comprising:

heating the film of the substrate after the supplying of the third chemical liquid to the peripheral portion of the substrate.

15. The substrate processing method of claim 9, further comprising:

forming a second protective film on the peripheral portion of the substrate after the supplying of the third chemical liquid to the peripheral portion of the substrate;

performing a developing processing of the film of the substrate on which the second protective film is formed;

supplying a fourth chemical liquid for removing the metal component to the peripheral portion of the substrate on which the developing processing of the film is performed; and supplying a fifth chemical liquid for removing the second protective film to the peripheral portion of the substrate after the supplying of the fourth chemical liquid to the peripheral portion of the substrate.

16. The substrate processing method of claim 9, further comprising:

performing a developing processing of the film of the substrate before the supplying of the third chemical liquid to the peripheral portion of the substrate and after the supplying of the second chemical liquid to the peripheral portion of the substrate; and supplying a fourth chemical liquid for removing the metal component to the peripheral portion of the substrate before the supplying of the third chemical liquid to the peripheral portion of the substrate on which the developing processing of the film is performed.

17. A computer-readable recording medium having stored thereon computer-executable instructions that, in response to execution, cause an apparatus to perform a substrate processing method as claimed in claim 9.

* * * * *